United States Patent
Shinohara

(10) Patent No.: US 11,818,488 B2
(45) Date of Patent: Nov. 14, 2023

(54) PHOTOELECTRIC CONVERSION DEVICE, PHOTOELECTRIC CONVERSION SYSTEM, AND MOVING BODY

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/158,986

(22) Filed: Jan. 26, 2021

(65) Prior Publication Data

US 2021/0243400 A1 Aug. 5, 2021

(30) Foreign Application Priority Data

Jan. 30, 2020 (JP) .................................. 2020-013718

(51) Int. Cl.
*H04N 25/772* (2023.01)
*G01C 3/02* (2006.01)
*H01L 27/146* (2006.01)
*H04N 25/63* (2023.01)

(52) U.S. Cl.
CPC ............ *H04N 25/772* (2023.01); *G01C 3/02* (2013.01); *H01L 27/1461* (2013.01); *H04N 25/63* (2023.01)

(58) Field of Classification Search
CPC ...... H04N 5/37455; H04N 5/361; G01C 3/02; G01C 3/08; H01L 27/1461; H01L 27/14603; H01L 27/14616
See application file for complete search history.

(56) References Cited

U.S. PATENT DOCUMENTS

| | | | |
|---|---|---|---|
| 2002/0024058 A1 | 2/2002 | Marshall et al. | |
| 2011/0102620 A1* | 5/2011 | Sakano | H04N 5/2176 |
| | | | 348/222.1 |
| 2015/0115131 A1 | 4/2015 | Webster | |
| 2015/0264283 A1* | 9/2015 | Kobayashi | H01L 27/14603 |
| | | | 257/229 |
| 2016/0373676 A1* | 12/2016 | Zhang | H04N 5/332 |
| 2017/0192090 A1* | 7/2017 | Roy | H01L 27/14612 |
| 2018/0213174 A1 | 6/2018 | Sano | |
| 2020/0219908 A1* | 7/2020 | Minari | H01L 27/1464 |

FOREIGN PATENT DOCUMENTS

| | | | | |
|---|---|---|---|---|
| JP | S61152176 A | | 7/1986 | |
| JP | 2013247289 A | | 12/2013 | |
| JP | 2019009427 A | * | 1/2019 | ....... H01L 31/02027 |
| JP | 2019192903 A | | 10/2019 | |

* cited by examiner

*Primary Examiner* — Tracy Y. Li
(74) *Attorney, Agent, or Firm* — CANON U.S.A., INC. IP Division

(57) ABSTRACT

Provided is a photoelectric conversion device including: at least one charge holding portion including a first semiconductor region of a first conductivity type and configured to hold signal charges based on incident light; and an avalanche photodiode including a second semiconductor region of the first conductivity type, in which the signal charges are transferred from the first semiconductor region to the second semiconductor region via a third semiconductor region of a second conductivity type that is different from the first conductivity type, a fourth semiconductor region of the first conductivity type, and a fifth semiconductor region of the second conductivity type in this order.

20 Claims, 18 Drawing Sheets

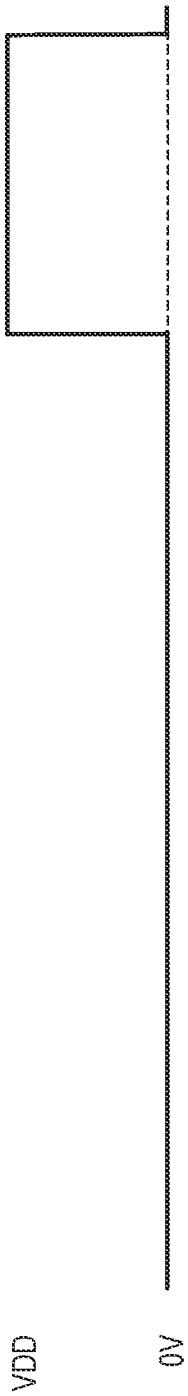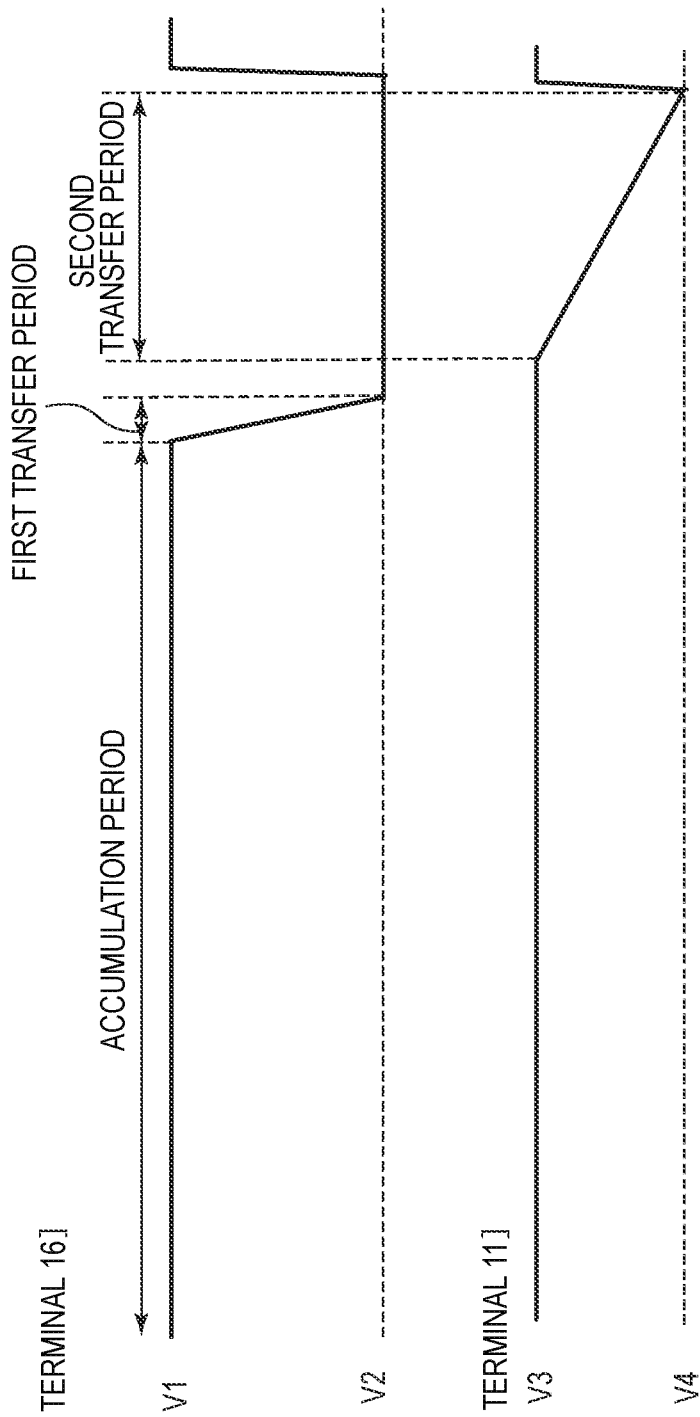
FIG. 6

FIG. 8
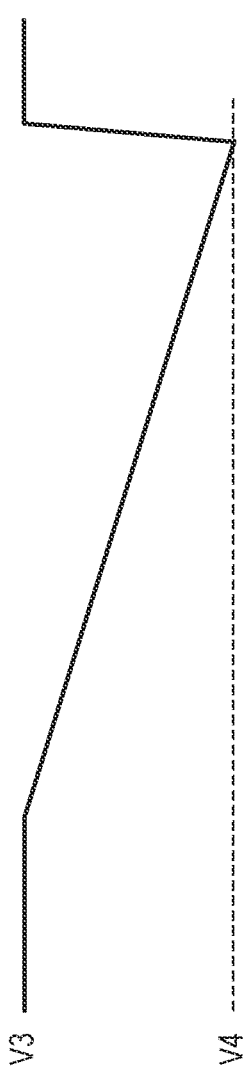
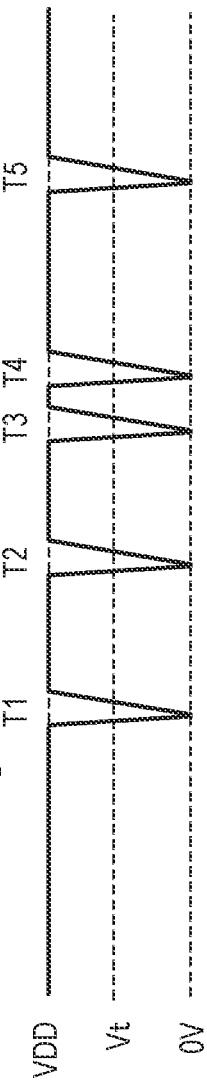
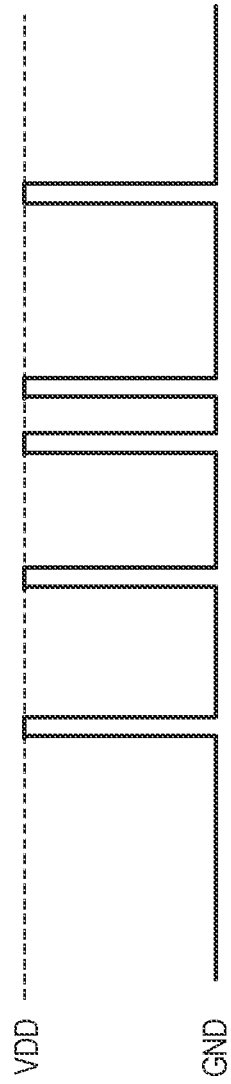

PHOTOELECTRIC CONVERSION DEVICE, PHOTOELECTRIC CONVERSION SYSTEM, AND MOVING BODY

BACKGROUND OF THE DISCLOSURE

Field of the Disclosure

The aspect of the embodiments relates to a photoelectric conversion device, a photoelectric conversion system, and a moving body.

Description of the Related Art

Photoelectric conversion devices including Avalanche Photodiodes (hereafter, also referred to as APD) are known. An APD avalanche-multiplies an incident photon. A photoelectric conversion device including an APD can detect incidence of a photon by detecting current amplified by the avalanche multiplication (avalanche current). Therefore, the photoelectric conversion device including an APD is less likely to be affected by noise that may occur in a signal detection circuit and even can detect the time a photon enters the APD. The photoelectric conversion devices including APDs have such characteristics and thus are widely used in the fields of optical communication, medical treatment, scientific measurement, and the like.

Further, Single-Photon Avalanche Diodes (hereafter, also referred to as SPAD) that count the number of photons entering an APD are also known. Japanese Patent Application Laid-Open No. S61-152176 and the specification of U.S. Patent Application Publication No. 2015/0115131 disclose an image sensor in which a plurality of SPADs are two-dimensionally arranged.

In photoelectric conversion devices using avalanche photodiodes, there is a demand for improved accuracy in detection of a photon.

SUMMARY OF DISCLOSURE

According to an aspect of the embodiments, provided is a device including: at least one charge holding portion including a first semiconductor region of a first conductivity type that holds and configured to hold signal charges based on incident light; and an avalanche photodiode including a second semiconductor region of the first conductivity type. The signal charges are transferred from the first semiconductor region to the second semiconductor region via a third semiconductor region of a second conductivity type, a fourth semiconductor region of the first conductivity type, and a fifth semiconductor region of the second conductivity type in this order.

According to another aspect of the embodiments, provided is a device including: a charge holding portion including a first semiconductor region of a first conductivity type and configured to hold signal charges based on incident light; and an avalanche photodiode including a second semiconductor region of the first conductivity type. A plurality of potential barriers are arranged on a transfer path of the signal charges from the first semiconductor region to the second semiconductor region. The signal charges are transferred from the first semiconductor region to the second semiconductor region in response to a change in levels of the plurality of potential barriers.

Further features of the disclosure will become apparent from the following description of exemplary embodiments with reference to the attached drawings.

BRIEF DESCRIPTION OF THE DRAWINGS

FIG. 6 is a timing diagram illustrating the operation of the photoelectric conversion element according to the first embodiment.

FIG. 8 is a timing diagram illustrating the operation of the photoelectric conversion element and the pixel signal processing unit according to the first embodiment.

DESCRIPTION OF THE EMBODIMENTS

Exemplary embodiments of the disclosure will now be described in detail in accordance with the accompanying drawings. The same components or corresponding components throughout multiple drawings are labeled with common references, and the description thereof may be omitted or simplified.

Further, in the following embodiments, a signal charge is an electron. Further, the first conductivity type is the N-type, and the second conductivity type is the P-type. However, the signal charge may be a hole. In such a case, the first conductivity type is the P-type and the second conductivity type is the N-type in semiconductor regions in the following description.

First Embodiment

Figure 1:
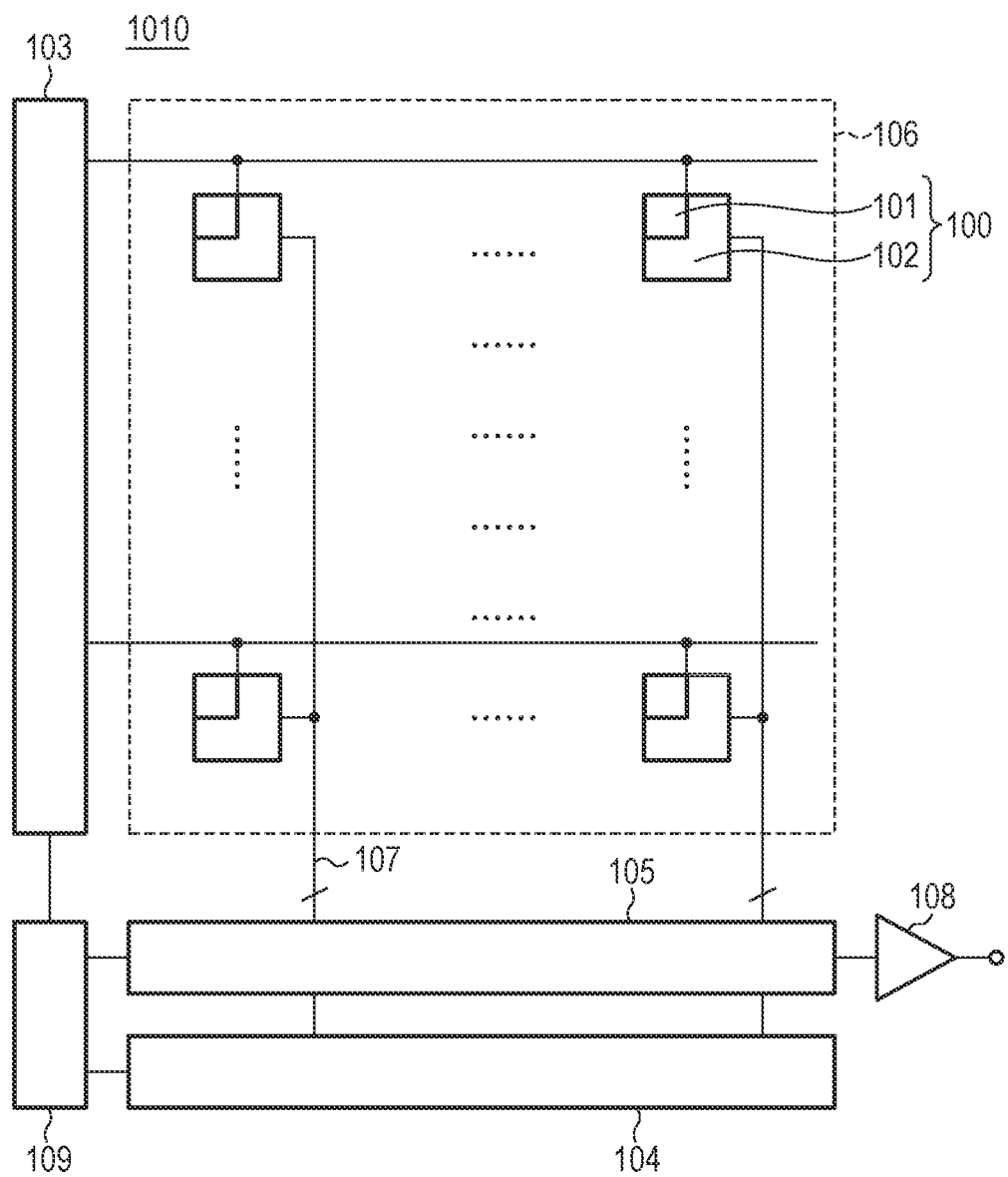
FIG. 1 is a block diagram illustrating a general configuration of a photoelectric conversion device according to a first embodiment.

FIG. 1 is a block diagram illustrating a general configuration of a photoelectric conversion device 1010 according to the present embodiment. The photoelectric conversion device 1010 has a vertical selection circuit 103, a horizontal selection circuit 104, a column circuit 105, a pixel unit 106, signal lines 107, an output circuit 108, and a control circuit 109. Note that, although the photoelectric conversion device 1010 of the present embodiment is an imaging device that acquires an image, the embodiment is not limited thereto. For example, the photoelectric conversion device 1010 may be a focus detection device, a ranging device, a Time-Of-Flight (TOF) camera, or the like.

The pixel unit 106 has a plurality of pixels 100 arranged in a matrix. Each pixel 100 includes a photoelectric conversion element 101 and a pixel signal processing unit 102. The photoelectric conversion element 101 photoelectrically converts incident light into an electrical signal. The pixel signal processing unit 102 processes and outputs a converted electrical signal to the column circuit 105.

Note that, in this specification, "light" may include an electromagnetic wave of any wavelength. That is, "light" is not limited to visible light and may include invisible light such as infrared ray, ultraviolet ray, X ray, gamma ray, or the like.

The control circuit 109 generates control pulses that drive the vertical selection circuit 103, the horizontal selection circuit 104, and the column circuit 105 and supplies the control pulses to respective circuits. Accordingly, the control circuit 109 controls drive timings or the like of respective circuits.

The vertical selection circuit 103 supplies a control signal to each of the plurality of pixels 100 based on control signals supplied from the control circuit 109. As illustrated in FIG. 1, the vertical selection circuit 103 supplies control signals on a row basis to respective pixels 100 via control signal lines provided for each row of the pixel unit 106. A logic circuit such as a shift register, an address decoder, or the like may be used for the vertical selection circuit 103.

The signal line 107 is provided for each column of the pixel unit 106 and transfers an output signal from each of the pixels 100 on a row selected by the vertical selection circuit 103 to the column circuit 105 in the post stage of the pixel 100 as a digital signal. The column circuit 105 performs a predetermined process on a signal input via the signal line 107 from each pixel 100. The predetermined process is a process such as removal of noise, amplification, conversion of the output format, or the like performed on an input signal, for example. To implement these functions, the column circuit 105 may have a sense amplifier, a memory, a parallel-to-serial conversion circuit, or the like.

The horizontal selection circuit 104 supplies, to the column circuit 105, control pulses used for sequentially outputting signals resulted from the predetermined process to the output circuit 108 based on control pulses supplied from the control circuit 109. The output circuit 108 includes a buffer amplifier, a differential amplifier, or the like and outputs an output signal from the column circuit 105 to a storage unit or a signal processing unit outside the photoelectric conversion device 1010.

The control circuit 109 is a circuit for supplying control signals that control operations or the timing of the operations of the vertical selection circuit 103, the horizontal selection circuit 104, the column circuit 105, and the output circuit 108. Note that the vertical selection circuit 103, the horizontal selection circuit 104, the column circuit 105, and the output circuit 108 may be driven by control signals supplied from the external of the photoelectric conversion device 1010.

In FIG. 1, the arrangement of the pixels 100 inside the pixel unit 106 may be one-dimensional or may include only a single pixel 100. When the pixels 100 inside the pixel unit 106 are divided into several blocks, a plurality of vertical selection circuits 103, a plurality of horizontal selection circuits 104, and a plurality of column circuits 105 may be arranged in association with respective blocks.

The pixel signal processing unit 102 is not necessarily required to be provided to all the pixels 100 in one-to-one manner. For example, a single pixel signal processing unit 102 may be shared by a plurality of pixels 100. In such a case, the pixel signal processing unit 102 provides a signal processing function to each pixel by sequentially processing signals output from respective photoelectric conversion elements 101.

Further, the pixel signal processing unit 102 may be provided on a separate semiconductor substrate from a semiconductor substrate on which the photoelectric conversion element 101 is provided. In such a case, it is possible to improve sensitivity by improving a ratio of the area that can receive light (opening ratio) in the photoelectric conversion element 101. The photoelectric conversion element 101 and the pixel signal processing unit 102 are electrically connected to the signal line 107 via a connection wiring provided on a pixel 100 basis. Each of the signal lines 107 may include n signal lines that transfer an n-bit digital signal. Note that the vertical selection circuit 103, the horizontal selection circuit 104, the column circuit 105, and the signal lines 107 may be provided on a separate semiconductor substrate from the semiconductor substrate on which the photoelectric conversion element 101 is provided, in the same manner as the pixel signal processing unit 102.

Figure 2:
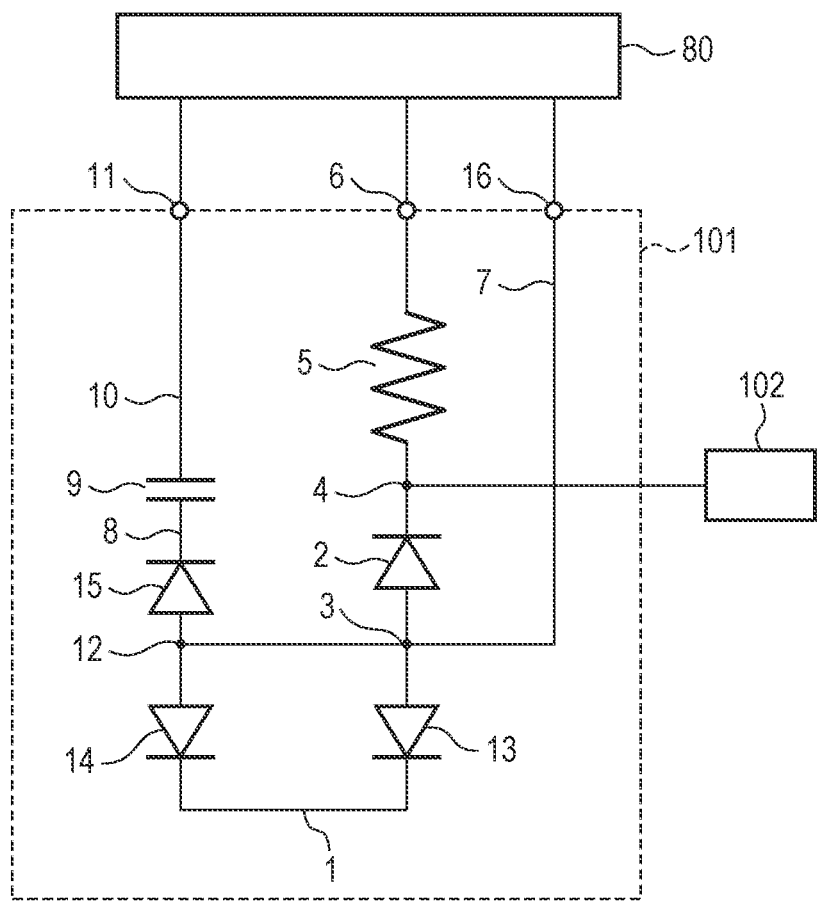
FIG. 2 is an equivalent circuit diagram of a photoelectric conversion element according to the first embodiment.

FIG. 2 is an equivalent circuit diagram of the photoelectric conversion element 101 according to the present embodiment. The photoelectric conversion element 101 has an avalanche photodiode (APD) 2, a photodiode (PD) 13, parasitic diodes 14 and 15, a resistor 5, a capacitor 9, and terminals 6, 11, and 16. Further, the photoelectric conversion element 101 has N-type semiconductor regions 1, 4, and 8, P-type semiconductor regions 3 and 12, and electrodes 7 and 10.

The PD 13 is a diode having the N-type semiconductor region 1 as the cathode and the P-type semiconductor region 3 as the anode. The N-type semiconductor region 1 is a sensitive region that generates signal charges by photoelectrically converting incident light.

The APD 2 is a diode having the N-type semiconductor region 4 as the cathode and the P-type semiconductor region 3 as the anode. The electrode 7 controls the potential of the P-type semiconductor region 3. The first terminal of the resistor 5 is connected to the N-type semiconductor region 4. The node of the N-type semiconductor region 4 is the output terminal of the photoelectric conversion element 101 and is connected to the pixel signal processing unit 102.

The parasitic diode 14 is a diode having the N-type semiconductor region 1 as the cathode and the P-type semiconductor region 12 as the anode. The P-type semiconductor region 12 and the P-type semiconductor region 3 are conducted to each other. The parasitic diode 15 is a diode having the N-type semiconductor region 8 as the cathode and the P-type semiconductor region 12 as the anode. The N-type semiconductor region 8 functions as a charge holding portion.

The electrode 10 is formed of a conductive material such as a polysilicon, a metal, or the like. The capacitor 9 is a MOS diode (MOS capacitor) formed by the electrode 10 and the N-type semiconductor region 8 being arranged interposing an insulating layer such as silicon oxide. The electrode 10 controls the potential of the N-type semiconductor region 8 via the capacitor 9.

The terminal 6 is a node of the second terminal of the resistor 5. The terminal 11 is a node of the electrode 10. The terminal 16 is a node of the electrode 7. The terminals 6, 11, and 16 each are a control terminal used for controlling the photoelectric conversion element 101. The terminals 6, 11, and 16 are connected to a voltage control unit 80. The voltage control unit 80 controls the photoelectric conversion element 101 by controlling the voltages of the terminals 6, 11, and 16.

Figure 3:
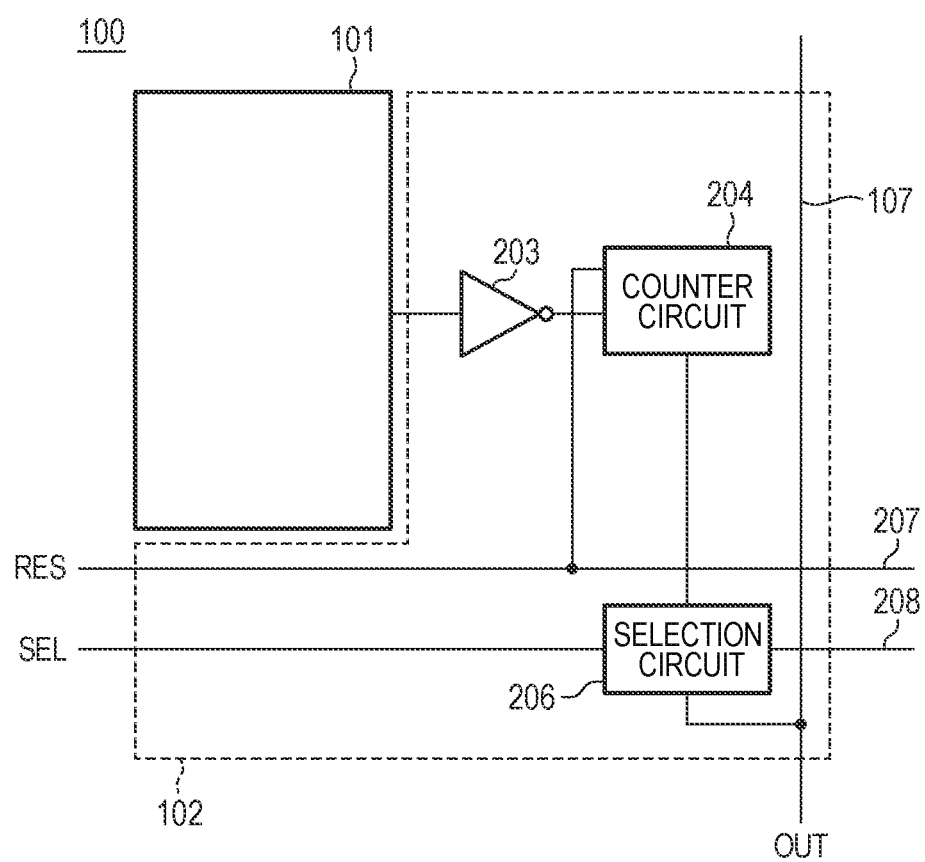
FIG. 3 is a block diagram of a pixel signal processing unit according to the first embodiment.

FIG. 3 is a block diagram of the pixel signal processing unit 102 according to the present embodiment. The pixel signal processing unit 102 has an inverter circuit 203, a counter circuit (count unit) 204, and a selection circuit 206.

The inverter circuit 203 shapes the potential change at the output node of the photoelectric conversion element 101 to output a pulse signal. When the potential of the N-type semiconductor region 4 (the cathode of the APD 2) is higher than or equal to the threshold of the inverter circuit 203, the output of the inverter circuit 203 is at a low level. On the other hand, when the potential of the N-type semiconductor region 4 is lower than the threshold of the inverter circuit 203, the output of the inverter circuit 203 is at a high level. That is, a binarized pulse signal is output from the inverter circuit 203. That is, the inverter circuit 203 serves as a comparator. A square pulse signal is output from the inverter circuit 203 in accordance with whether or not a signal charge avalanche-multiplied by the APD 2 is present. While a comparator using a differential amplifier may be used instead of the inverter circuit 203, an inverter circuit with a small circuit scale is used in FIG. 3.

The counter circuit 204 (count unit) is connected to the inverter circuit 203, counts the number of pulses output from the inverter circuit 203, and outputs an accumulated count value. The counter circuit 204 may be, for example, an N-bit counter (N: positive integer). In such a case, the counter circuit 204 can count the number of pulses up to approximately the N-th power of 2 at the maximum. The counted number is held in the counter circuit 204 as a detection signal. Further, a control signal RES may be supplied to the counter circuit 204 from the vertical selection circuit 103 via a drive line 207. In response to the control signal RES being supplied to the counter circuit 204, the held counted number is reset. In such a way, the counter circuit 204 counts the number of times of occurrence of avalanche current occurring when at least one signal charge is transferred to the APD 2 and avalanche-multiplied.

The selection circuit 206 switches electrical connection and disconnection between the counter circuit 204 and the signal line 107. A control signal SEL is supplied to the selection circuit 206 from the vertical selection circuit 103 via a drive line 208. In response to the control signal SEL being supplied to the selection circuit 206, the electrical connection or disconnection between the counter circuit 204 and the signal line 107 is switched in accordance with the level of the control signal SEL. The selection circuit 206 may include a transistor, a buffer circuit used for outputting a signal to the external of the pixel 100, or the like, for example. When the counter circuit 204 and the signal line 107 are electrically connected, the count value held in the counter circuit 204 is output to the signal line 107.

Note that, instead of the selection circuit 206, a switch such as a transistor may be provided at the node between the terminal 6 and the APD 2 or between the photoelectric conversion element 101 and the pixel signal processing unit 102. Also in such a case, the same function as the selection circuit 206 may be implemented by switching the switch to be connected or disconnected. Similarly, supply of a potential from the voltage control unit 80 to the terminal 6 may be electrically switched by using a switch such as a transistor.

When a plurality of counter circuits 204 are arranged, a plurality of signals may be supplied to the selection circuit 206. Accordingly, it is possible to control the output to the signal line 107 for each counter circuit 204 when outputting a count value held in the counter circuit 204 to the signal line 107.

A count value that is a digital signal held in the counter circuit 204 serves as a signal used for forming a captured image. Specifically, a captured image may be acquired by a rolling shutter operation in the pixel unit 106 in which a plurality of pixels 100 are arranged in a matrix. That is, the count values of the counter circuits 204 may be reset sequentially on a row basis, and the count values held by the counter circuits 204 may be output sequentially on a row basis. Further, a captured image may be acquired by a global electronic shutter operation. In the global electronic shutter operation, count values of the counter circuits 204 on all the pixel rows may be reset simultaneously, and detected signals held in the counter circuits 204 may be output sequentially on a row basis.

Note that, when a global electronic shutter operation is performed, to cause pulse count to occur at the same time on respective rows, in one embodiment, a unit that switches whether or not to perform the count in the counter circuit 204 is added. The unit that switches whether or not to perform the count may be, for example, a switch such as a transistor.

Further, instead of the counter circuit 204, a Time to Digital Converter (hereafter, referred to as a TDC) and a memory may be provided. In such a case, the photoelectric conversion device 1010 can acquire the timing at which a pulse is detected.

In this modified example, the occurrence timing of a pulse signal output from the inverter circuit 203 is converted into a digital signal by the TDC. The control signal RES is supplied to the TDC from the vertical selection circuit 103 via a drive line as a reference signal used for measurement of a timing of a pulse signal. The TDC acquires a digital signal corresponding to the input time of a pulse from the inverter circuit 203 by using the control signal RES as a reference of time.

For example, a delay line scheme forming a delay circuit using a delay line in which buffer circuits are connected in series, a looped TDC scheme using a circuit in which delay lines are connected in a loop, or the like may be used for the circuit of the TDC. Although other schemes may be used, in one embodiment, a scheme that can achieve time resolution that is the same as or higher than time resolution of the photoelectric conversion element 101 is employed for the circuit of the TDC in order to ensure sufficient time resolution.

A digital signal acquired by the TDC is held in one or a plurality of memories. When the number of memories is plural, it is possible to output a signal selectively to the signal line 107 from any of the plurality of memories by supplying a plurality of control signals SEL to the selection circuit 206.

Figure 4:
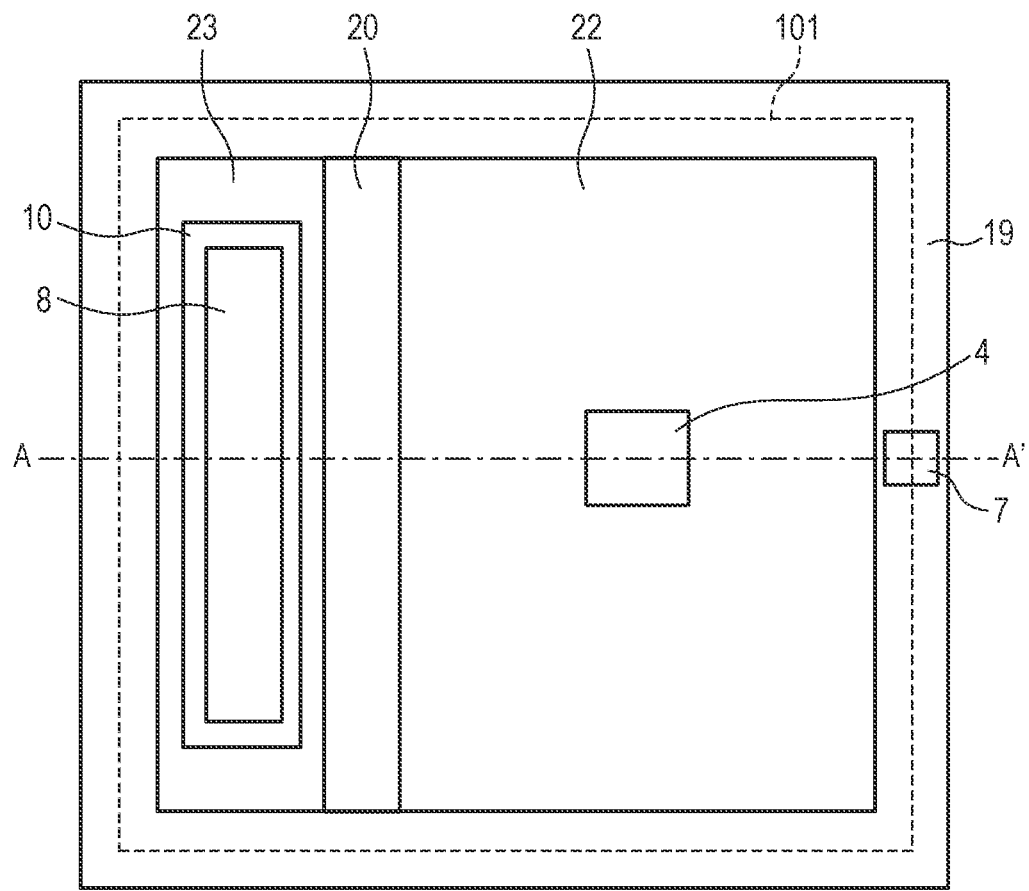
FIG. 4 is a schematic plan view of the photoelectric conversion element according to the first embodiment.
Figure 5:
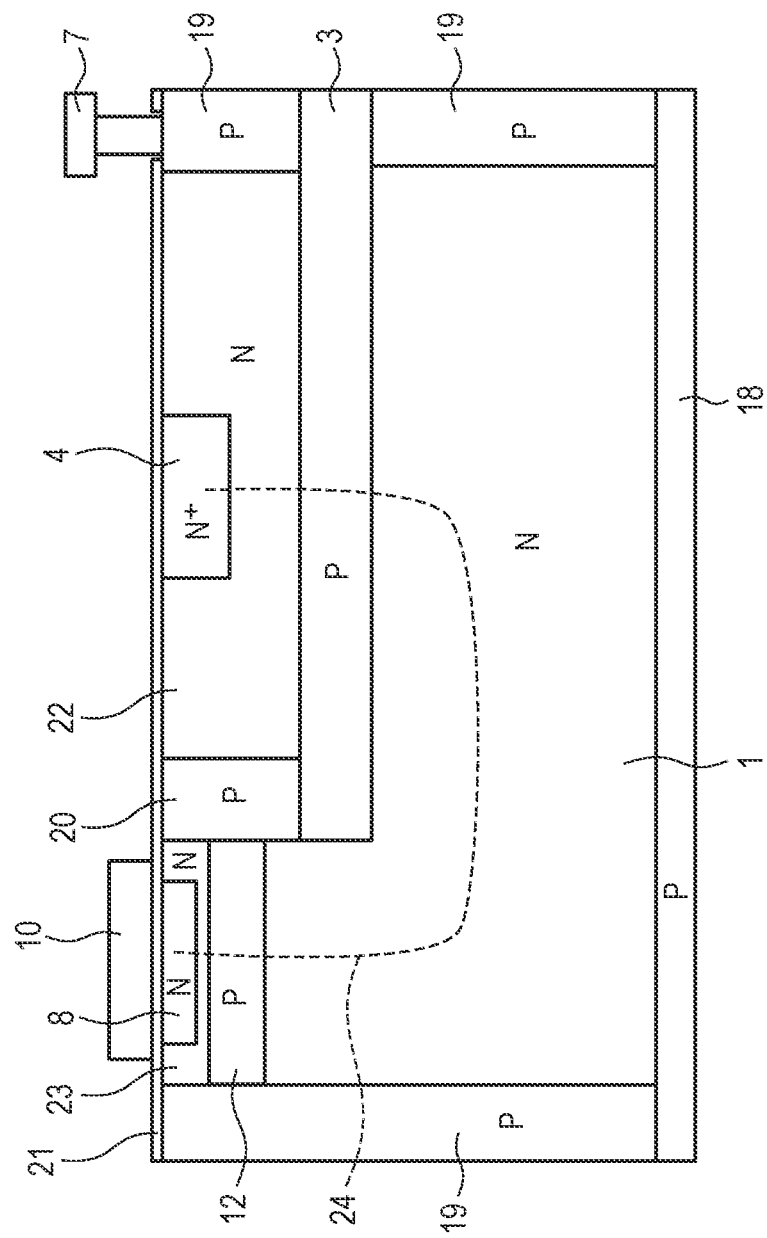
FIG. 5 is a schematic sectional view of the photoelectric conversion element according to the first embodiment.

FIG. 4 is a schematic plan view of the photoelectric conversion element 101 according to the present embodiment, and FIG. 5 is a schematic sectional view of the photoelectric conversion element 101 according to the present embodiment. FIG. 4 and FIG. 5 focus on and illustrate one of the plurality of photoelectric conversion elements 101 formed on the semiconductor substrate, and a range indicated by a dashed line in FIG. 4 corresponds to the one photoelectric conversion element 101. Incident light to the photoelectric conversion element 101 enters the semiconductor substrate illustrated in FIG. 5 from the lower surface side (backside) thereof. FIG. 5 illustrates a cross section taken along a line A-A' of FIG. 4. The structure of the photoelectric conversion element 101 will be described with reference to FIG. 4 and FIG. 5 each other.

The photoelectric conversion element 101 has N-type semiconductor regions 1, 4, 8, 22, and 23, P-type semiconductor regions 3, 12, 18, 19, and 20, the electrodes 7 and 10, and an insulating layer 21. The P-type semiconductor region 19 isolates a plurality of photoelectric conversion elements 101 from each other. Further, the electrode 7 (second electrode) is arranged on a part of the P-type semiconductor region 19. The P-type semiconductor region 20 isolates a region in which the capacitor 9 is formed from a region in which the APD 2 is formed. The P-type semiconductor region 18 is arranged on the interface of the backside of the semiconductor substrate.

The N-type semiconductor region 1 (fourth semiconductor region) that is a sensitive region that generates signal charges is arranged above the P-type semiconductor region 18. The P-type semiconductor region 3 (fifth semiconductor region) and the P-type semiconductor region 12 (third semiconductor region) are arranged above the N-type semiconductor region 1. The N-type semiconductor region 23 and the N-type semiconductor region 8 (first semiconductor region) are arranged in this order above the P-type semiconductor region 12. Note that the semiconductor region 23 is the N-type semiconductor region but may be a P-type semiconductor region with a lower impurity concentration than the P-type semiconductor region 12 in some cases. The N-type semiconductor region 22 and the N-type semiconductor region 4 are arranged in this order above the P-type semiconductor region 3. The P-type semiconductor regions 3, 12, 18, 19, and 20 are electrically connected. The insulating layer 21 is arranged above the N-type semiconductor regions 4, 8, 22, and 23 and the P-type semiconductor regions 19 and 20. The electrode 10 (first electrode) is arranged above the N-type semiconductor region 8 interposing the insulating layer 21 therebetween.

The P-type semiconductor region 3 and the N-type semiconductor regions 4 and 22 form the APD 2. The N-type semiconductor region 22 is a region with a lower impurity concentration than the N-type semiconductor region 4. The N-type semiconductor region 22 (second semiconductor region) is a depletion region in the APD 2. Further, the P-type semiconductor region 3 and the N-type semiconductor region 1 form the PD 13.

The P-type semiconductor region 12 and the N-type semiconductor region 1 form the parasitic diode 14, and the P-type semiconductor region 12 and the N-type semiconductor regions 8 and 23 form the parasitic diode 15. The N-type semiconductor region 8, the insulating layer 21, and the electrode 10 form the capacitor 9.

A transfer path 24 indicated by a dashed line in FIG. 5 is a path through which signal charges are transferred from the N-type semiconductor region 8, which functions as a charge holding portion, to the APD 2. The N-type semiconductor region 23, the P-type semiconductor region 12, the N-type semiconductor region 1, the P-type semiconductor region 3, and the N-type semiconductor region 22 are arranged in this order on the transfer path 24 (transfer portion). The transfer path 24 will be described below for such transfer of signal charges.

Figure 7:
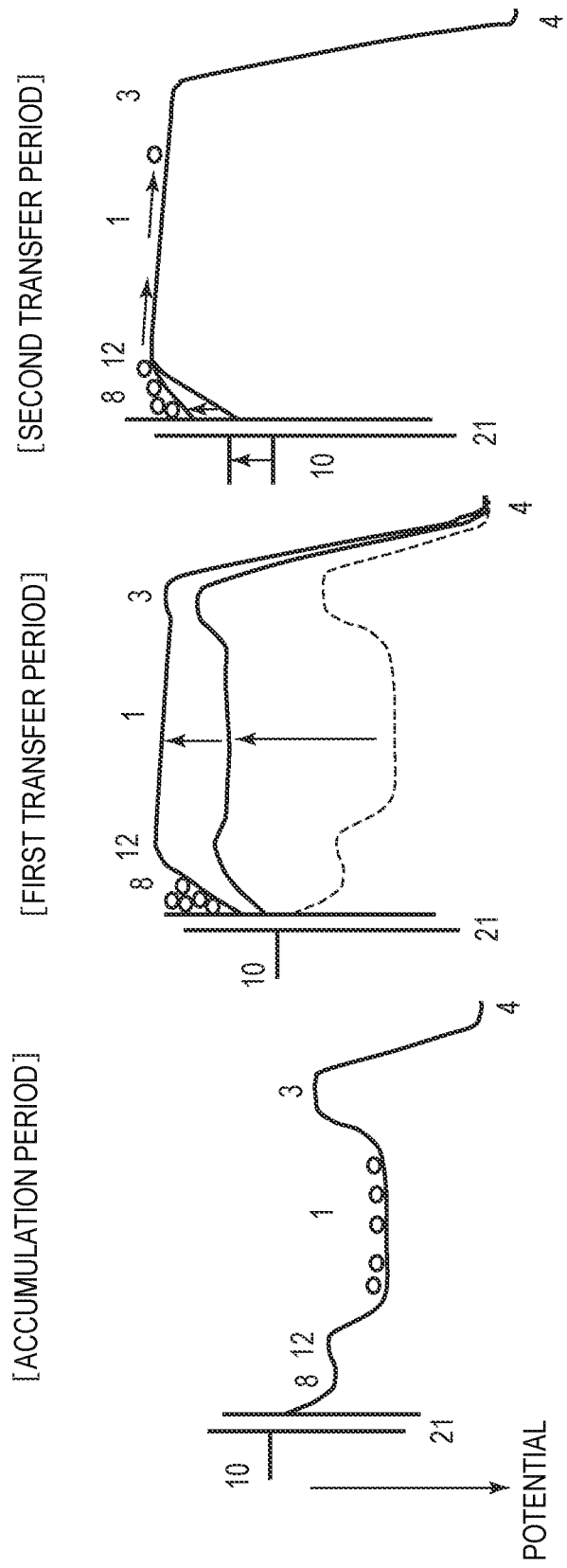
FIG. 7 is a potential diagram of the photoelectric conversion element according to the first embodiment.

FIG. 6 is a timing diagram illustrating the operation of the photoelectric conversion element 101 according to the present embodiment, and FIG. 7 is a potential diagram of the photoelectric conversion element 101 according to the present embodiment. FIG. 8 is a timing diagram illustrating the operation of the photoelectric conversion element 101 and the pixel signal processing unit 102 according to the present embodiment.

FIG. 6 illustrates a temporal change of the potential supplied from the voltage control unit 80 to the terminals 6, 11, and 16. FIG. 7 schematically illustrates the potential of portions along the transfer path 24. Since the potential illustrated in FIG. 7 is the potential relative to a signal electron having a negative charge, the lower side in FIG. 7 corresponds to a higher potential. The references provided in the potential diagram of FIG. 7 indicate positions at which members of corresponding references in FIG. 5 are arranged. Further, each circular symbol provided in the potential diagram of FIG. 7 indicates a signal electron. FIG. 8 illustrates the temporal change of the potential of the terminal 11, the potential of the N-type semiconductor region 4 (input potential of the inverter circuit 203), and the output potential of the inverter circuit 203. Note that FIG. 8 focuses on and illustrates the period near the second transfer period in FIG. 6.

As illustrated in FIG. 6, the operation of the photoelectric conversion element 101 is typically divided into an accumulation period, a first transfer period, and a second transfer period. FIG. 7 illustrates the potential diagram of the accumulation period, the first transfer period, and the second transfer period. The operation of the photoelectric conversion element 101 will be described with reference to FIG. 6 and FIG. 7 each other.

First, the operation of the photoelectric conversion element 101 in the accumulation period will be described. The accumulation period is a period in which signal electrons generated due to incident light from the backside of the semiconductor substrate are accumulated in the N-type semiconductor region 1. In the accumulation period, the potential of the terminal 6 is 0 V, the potential of the terminal 16 is V1, and the potential of the terminal 11 is V3. The potential V1 of the terminal 16 is −5 V, for example. At this time, a reverse bias voltage of 5 V is applied between the cathode and the anode of the APD 2. The reverse bias voltage at which avalanche multiplication occurs in the APD 2 is around 25 V, for example. Therefore, in the accumulation period, the APD 2 is in an inactive state where no avalanche multiplication occurs.

The potential V3 of the terminal 11 is −15 V, for example. Further, the threshold voltage of a MOS diode forming the capacitor 9 is −1 V, for example. At this time, the semiconductor side of the MOS diode is in a so-called pinning state, and holes are accumulated on the interface. Since the N-type semiconductor region 8 is formed near the interface of the MOS diode, most of the N-type semiconductor region 8 is in a state where holes are already accumulated and no electron can be accepted. Therefore, signal electrons generated due to incident light from the backside of the semiconductor substrate do not move to the N-type semiconductor region 8 and are accumulated in the N-type semiconductor region 1.

As illustrated in FIG. 7, when viewed from the signal electron present in the N-type semiconductor region 1, the P-type semiconductor region 3 and the P-type semiconductor region 12 serve as a potential barrier in the accumulation period due to the mechanism described above. Therefore, signal electrons are accumulated in the N-type semiconductor region 1.

Note that, when signal electrons are saturated in the N-type semiconductor region 1, overflowing signal electrons flow not to the N-type semiconductor region 8 but to the N-type semiconductor region 4 side. That is, the N-type semiconductor region 4 has a function of an overflow drain during the accumulation period.

Next, the operation of the photoelectric conversion element 101 in the first transfer period will be described. The first transfer period is a period in which signal electrons accumulated in the N-type semiconductor region 1 are transferred to the N-type semiconductor region 8. In the first transfer period, the potential of the terminal 16 gradually changes from V1 to V2. Further, in the same manner as in the accumulation period, the potential of the terminal 6 is 0 V, and the potential of the terminal 11 is V3. The potential V2 is −25 V, for example.

When the potential of the P-type semiconductor region 3 changes from V1 to V2 in response to the change of the potential of the terminal 16, the reverse bias voltage of the APD 2 increases, and the P-type semiconductor region 3 is depleted. In response, the potential barrier of the P-type semiconductor region 3 viewed from a signal electron present in the N-type semiconductor region 1 decreases.

Although the potential of the N-type semiconductor region 8 is not fixed, since the potential of the electrode 10 provided from the terminal 11 is fixed to V3, the variation of the potential of the N-type semiconductor region 8 is small. Therefore, when the potential of the P-type semiconductor region 12 changes from a potential around V1 to a potential around V2 in response to the change of the potential of the terminal 16, the reverse bias voltage of the parasitic diode 15 increases, and the P-type semiconductor region 12 is depleted. In response, the potential barrier of the P-type semiconductor region 12 viewed from a signal electron present in the N-type semiconductor region 1 decreases.

Therefore, as illustrated in FIG. 7, in the first transfer period, both the potential barrier of the P-type semiconductor region 3 and the potential barrier of the P-type semiconductor region 12 decrease. Herein, the formation condition of the APD 2 and the parasitic diode 15 is determined such that depletion of the P-type semiconductor region 12 progresses earlier than the depletion of the P-type semiconductor region 3 in the first transfer period. Accordingly, a state where the potential barrier of the P-type semiconductor region 12 is substantially eliminated and the potential barrier of the P-type semiconductor region 3 is left is realized in the intermediate state in the way of the change of the potential of the terminal 16 from V1 to V2. FIG. 7 also illustrates the potential of such an intermediate state. The potential of the terminal 16 at this time is −18 V, for example.

In such an intermediate state, since the potential barrier of the P-type semiconductor region 12 is lower than the potential barrier of the P-type semiconductor region 3 when viewed from a signal electron present in the N-type semiconductor region 1, signal electrons are transferred to the P-type semiconductor region 12. For example, in a state where the potential of the terminal 16 is −20 V, it is assumed that transfer of signal electrons to the N-type semiconductor region 8 is completed and the potential barrier of the P-type semiconductor region 3 still remains.

Then, when the potential of the terminal 16 meets V2=−25 V, since the reverse bias voltage of the APD 2 becomes 25 V, the APD 2 approaches the boundary between an active state and an inactive state. In such a state, the photoelectric conversion elements 101 having active APDs 2 and the photoelectric conversion elements 101 having inactive APDs 2 are mixed due to the variation of the plurality of photoelectric conversion elements 101. At this point of time, the potential barrier of the P-type semiconductor region 3 is substantially lost.

At this point of time, however, signal electrons have already been transferred to the N-type semiconductor region 8. Since the potential barrier of the P-type semiconductor region 12 viewed from the signal electron held in the N-type semiconductor region 8 is large, the potential of the terminal 16 becomes V2, and even if the potential barrier of the P-type semiconductor region 3 is lost, no signal electron moves to the APD 2. In such a way, after the first transfer period passed, signal electrons based on incident light are temporarily held in the N-type semiconductor region 8.

Next, the operation of the photoelectric conversion element 101 in the second transfer period will be described. The second transfer period is a period in which signal electrons held in the N-type semiconductor region 8 are transferred to the APD 2 one by one. In the second transfer period, the potential of the terminal 11 gradually changes from V3 to V4. The potential V4 is −27 V, for example. The potential of the terminal 16 is the same V2 as that at the end of the first transfer period.

The potential of the terminal 6 has changed from 0 V to VDD prior to the second transfer period. The potential VDD is 3.3 V, for example. At this time, the reverse bias voltage of the APD 2 is 28.3 V. The power source voltage of the inverter circuit 203 connected to the N-type semiconductor region 4 that is the cathode of the APD 2 is VDD, and a threshold voltage Vt of the inverter circuit 203 is assumed to be 1.8 V that is close to VDD/2. Further, the variation of the reverse bias voltage at which avalanche multiplication occurs in the APD 2 is less than 1.8 V. With this condition, the APD 2 is in the active state if the potential of the N-type semiconductor region 4, that is, the input potential of the inverter circuit 203 is greater than or equal to the threshold voltage Vt. In other words, in order for the APD 2 to be in the inactive state, the potential of the N-type semiconductor region 4 is required to be less than the threshold voltage Vt of the inverter circuit 203. This is a condition where the inverter circuit 203 can reliably detect avalanche multiplication.

When the potential of the N-type semiconductor region 4 becomes VDD, the potential barrier of the P-type semiconductor region 3 viewed from the N-type semiconductor region 1 side is lost. At this time, as illustrated in FIG. 7, a potential gradient occurs from the P-type semiconductor region 12 to the P-type semiconductor region 3 due to influence of the large reverse bias voltage between the anode and the cathode of the APD 2. As described above, the potential of the terminal 11 gradually changes from V3 to V4, and thereby the potential of the N-type semiconductor region 8 gradually increases. That is, the potential barrier of the P-type semiconductor region 12 viewed from the signal electron accumulated in the N-type semiconductor region 8 relatively decreases. Accordingly, signal electrons gradually go over the potential barrier of the P-type semiconductor region 12 and reach the P-type semiconductor region 3 via the N-type semiconductor region 1. In such a way, signal electrons are gradually transferred from the N-type semiconductor region 8 to the APD 2.

The signal electrons that reached the APD 2 cause avalanche multiplication in the APD 2. At this time, avalanche current flows in the APD 2, and the potential of the N-type semiconductor region 4 decreases due to a voltage drop at the resistor 5. When the potential of the N-type semiconductor region 4 decreases to the potential at which the APD 2 enters the inactive state, the avalanche multiplication stops. This potential is 0 V in average. The potential of the N-type semiconductor region 4 then returns to VDD due to the potential provided from the terminal 6 via the resistor 5. Since the potential of the N-type semiconductor region 4 is the input potential of the inverter circuit 203, the output of the inverter circuit 203 is at the high level for the period in which the potential is less than the threshold voltage Vt in the course of the potential change described above. That is, the inverter circuit 203 outputs one pulse at the time one signal electron is transferred. Note that, to maintain the relationship of one signal electron corresponding to one pulse, the slope of the potential change of the terminal 11 is set such that the time interval of transfer of signal electrons is sufficiently longer than a period in which the potential is less than the threshold voltage Vt. That is, if a plurality of signal electrons are transferred to the APD 2 at substantially the same time, one pulse will occur resulting in a count loss. To prevent such a count loss, the slope of the potential change of the terminal 11 is reduced so that an individual signal electron to be transferred one by one is transferred to the APD 2 with a sufficient time interval.

In such a way, in response to signal electrons being transferred to the APD 2, the inverter circuit 203 outputs pulses corresponding to the number of transferred signal electrons. The counter circuit 204 counts the number of pulses and outputs the accumulated count value. In such a way, the number of signal electrons held in the N-type semiconductor region 8 is counted.

FIG. 8 illustrates an example when the number of signal electrons held in the N-type semiconductor region 8 is five. Each of times T1, T2, T3, T4, and T5 indicates the time one signal electron is transferred from the N-type semiconductor region 8 to the APD 2. At times T1, T2, T3, T4, and T5, the potential of the N-type semiconductor region 4 temporarily decreases. In response, the inverter circuit 203 outputs a pulse at each of times T1, T2, T3, T4, and T5. In such a way, the inverter circuit 203 outputs pulses corresponding to the same number as that of signal electrons held in the N-type semiconductor region 8. The counter circuit 204 can acquire a digital value indicating the number of signal electrons by counting the number of pulses.

Note that, although FIG. 8 illustrates the example in which the potential of the N-type semiconductor region 4 decreases from VDD to 0 V, this is an example, and the lower limit voltage of the N-type semiconductor region 4 may differ in accordance with variation of the reverse bias voltage at which avalanche multiplication occurs. As described above, however, since voltages of respective terminals or the like are set taking such variation into consideration, the number of pulses output from the inverter circuit 203 matches the number of signal electrons.

As discussed above, the photoelectric conversion device 1010 of the present embodiment operates as a SPAD that counts incident photons. The photoelectric conversion device 1010 of the present embodiment has a beneficial effect of improved accuracy in detection of photons. This beneficial effect will be described below in detail from two points of view.

A SPAD using a typical APD as disclosed in Japanese Patent Application Laid-Open No. S61-152176 or the specification of U. S. Patent Application Publication 2015/0115131 is controlled so that the APD is in the active state in a period when detection of incident light is performed.

Thus, during the operation, a reverse bias voltage that is larger than in the typical PD is continued to be applied between the anode and the cathode of the APD. When a carrier generation level is present between the anode and the cathode of an APD, a larger number of carriers than that at a low bias are generated due to the large reverse bias voltage, and large dark current may occur. Because of such a reason, in a SPAD, influence of dark current noise occurring in an APD is larger than a typical PD that operates at a low voltage, while there is a benefit of not being affected by noise and variation of amplification factors of signal readout circuits. This may cause a reduction in the SN ratio.

In contrast, in the present embodiment, the APD 2 is in the inactive state during the accumulation period. At this time, since no avalanche current flows in the APD 2, the power consumption of the photoelectric conversion element 101 is small. This is because the conventional SPAD generates count pulses basically involving avalanche multiplication all the time even when a large number of signal electrons occur. On the other hand, in the present embodiment, since signal electrons exceeding the number of saturated electrons of the N-type semiconductor region 1 flow away to the N-type semiconductor region 4 without involving avalanche multiplication during accumulation period, there is no occurrence of count pulses that consumes electrical energy. Further, in the accumulation period, even if a change of the potential caused by dark current in the APD 2 occurs, it is possible to avoid counting such a change by stopping the function of at least one of the inverter circuit 203 and the counter circuit 204. Therefore, the primary portion that may be affected by dark current in the accumulation period is the PD 13. The reverse bias voltage of the PD 13 in the accumulation period is substantially the same level as that of a PD of a typical CMOS image sensor, which does not involve avalanche multiplication, and typically is around 1 V to 2 V. The dark current occurring in the PD 13 is substantially the same level as that of a typical CMOS image sensor and much smaller than that of the APD 2 during an avalanche active state. Further, since the interface of the N-type semiconductor region 8 is in a pinning state, dark current occurring herein is also small. Because of the above reasons, influence of dark current noise occurring in the accumulation period is reduced in the photoelectric conversion element 101 of the present embodiment.

In the present embodiment, although there is a period in which the APD 2 is in the active state, such as the second transfer period, the length of such a period is shorter than the length of a period in which the APD 2 is in the inactive state. Specifically, when a normal image capturing is expected, for example, the length of an active state period is around 3 ms, and the length of an inactive state period is around 30 ms. Thus, the influence of dark current noise occurring in a period in which the APD 2 is in the active state is small. SPADs are, because of the nature thereof, often used for the purpose of reliably capturing a signal even under a dark environment with less incident light. Although the accumulation time period may be set to be longer, such as several hundred ms to several seconds in such a dark environment, such a condition makes it more notable how smaller the influence of dark current of the present embodiment is than in the conventional SPAD.

As discussed above, since the present embodiment is configured to accumulate signal electrons in the PD 13 in the accumulation period and transfer the signal electrons to the APD 2 to count charges, influence of dark current noise can be reduced.

Further, the photoelectric conversion device 1010 of the present embodiment has the N-type semiconductor region 8 that functions as a charge holding portion. A signal electron is transferred from the N-type semiconductor region 1 to the N-type semiconductor region 8 in the first transfer period, and a signal electron is transferred from the N-type semiconductor region 8 to the N-type semiconductor region 4 in the second transfer period. An additional beneficial effect provided by such a configuration will be described.

As another configuration example of the present embodiment, a configuration to transfer a signal charge directly from the PD to the APD without providing a charge holding portion may be considered. The problem in this modified configuration example will be described. In response to transfer of signal electrons from the PD to the APD, a large number of electrons and holes due to avalanche multiplication are generated. At least some of the electrons move to the cathode of the APD. Further, at least some of the holes move to the anode of the APD through a potential barrier due to the P-type semiconductor region between the PD and the APD.

At this time, the potential barrier may become lower due to a voltage drop caused by avalanche current, and a plurality of signal electrons accumulated in the PD may be transferred collectively at once. It can also be construed that this phenomenon occurs because holes collected in the P-type semiconductor region forming the potential barrier attract signal electrons accumulated in the PD by electrostatic force. A plurality of signal electrons transferred collectively in such a way are counted as one signal electron. For example, if it is assumed that 1000 signal electrons have been accumulated in the PD, one signal electron is transferred to the APD, and at the same time, another 99 signal electrons are transferred together, the 1000 signal electrons are counted as 10. In such a way, in this modified configuration example, the number of signal electrons may be unable to be accurately counted.

In contrast, in the second transfer period in the photoelectric conversion device 1010 of the present embodiment, signal electrons are held not in the N-type semiconductor region 1 forming the PD 13 but in the N-type semiconductor region 8. The potential barrier due to the P-type semiconductor region 12 is present between the N-type semiconductor region 8 and the APD 2. Accordingly, even if the potential barrier of the P-type semiconductor region 3 changes when avalanche multiplication occurs, the potential barrier due to the P-type semiconductor region 12 does not substantially change. In other words, in the present embodiment, two potential barriers are present between the N-type semiconductor region 1 forming the charge holding portion and the N-type semiconductor region 4 of the APD 2. Accordingly, the present embodiment has a potential distribution such that charges of the charge holding portion are not transferred together when avalanche multiplication occurs. Therefore, the phenomenon in which signal electrons held in the N-type semiconductor region 8 are transferred collectively in response to avalanche multiplication is less likely to occur. Therefore, since the number of signal electrons can be accurately counted, the accuracy is improved.

As discussed above, since the present embodiment has the N-type semiconductor region 8 that holds signal charges and is configured to transfer the signal electrons from the N-type semiconductor region 8 to the N-type semiconductor region 4 of the APD 2 in the second transfer period, it is possible to improve accuracy in counting signal electrons.

As described above, because of at least one of the reasons described in two points of view, a photoelectric conversion device with improved accuracy in detection of photons is provided according to the present embodiment.

Note that it is also possible to cause the N-type semiconductor region 8 to function as a charge accumulation portion in the same manner as the N-type semiconductor region 1 in the accumulation period. For example, in the accumulation period, when the potential V3 of the terminal 11 is −15 V, for example, the potential V1 of the terminal 16 is set to −20 V. In such a case, since there is substantially no potential barrier due to the P-type semiconductor region 12, signal electrons are accumulated also in the N-type semiconductor region 8. By performing the operation of the first transfer period and the second transfer period in the same manner as described above after the end of the accumulation period, it is possible to count signal electrons in the same manner.

In this operation example, since a part near the interface of the N-type semiconductor region 8 is depleted, relatively large dark current may occur from the N-type semiconductor region 8 during the accumulation period. However, since the capacitor 9 for which a MOS diode or the like is used can have a large capacitance than a PN junction or the like, the saturated signal amount can be increased in this operation example.

Therefore, under the condition that requires a larger saturation signal amount and is less likely to be affected by dark current, the operation to cause the N-type semiconductor region 8 to function as a charge accumulation portion may be effective. An example of the condition that is less likely to be affected by dark current may be a case where the amount of occurring dark current is small because of a low temperature, a case where the accumulation period is sufficiently short, or the like.

Second Embodiment

The photoelectric conversion device 1010 of the present embodiment is structured such that four pairs of the N-type semiconductor region 1, which accumulates signal electrons based on incident light, and the N-type semiconductor region 8, which temporarily holds signal electrons, are provided to one APD 2. In the illustration of the present embodiment, the description of components common to the first embodiment may be omitted or simplified.

Figure 9:
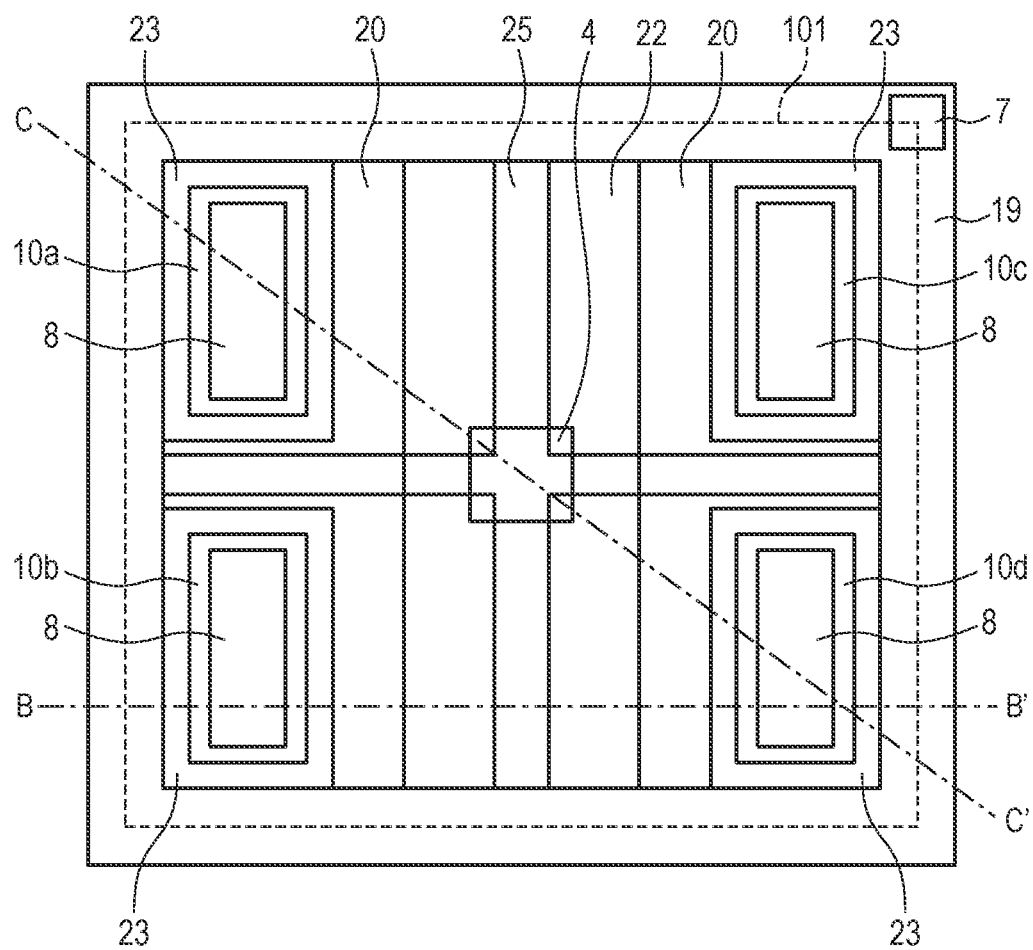
FIG. 9 is a schematic plan view of a photoelectric conversion element according to a second embodiment.
Figure 10:
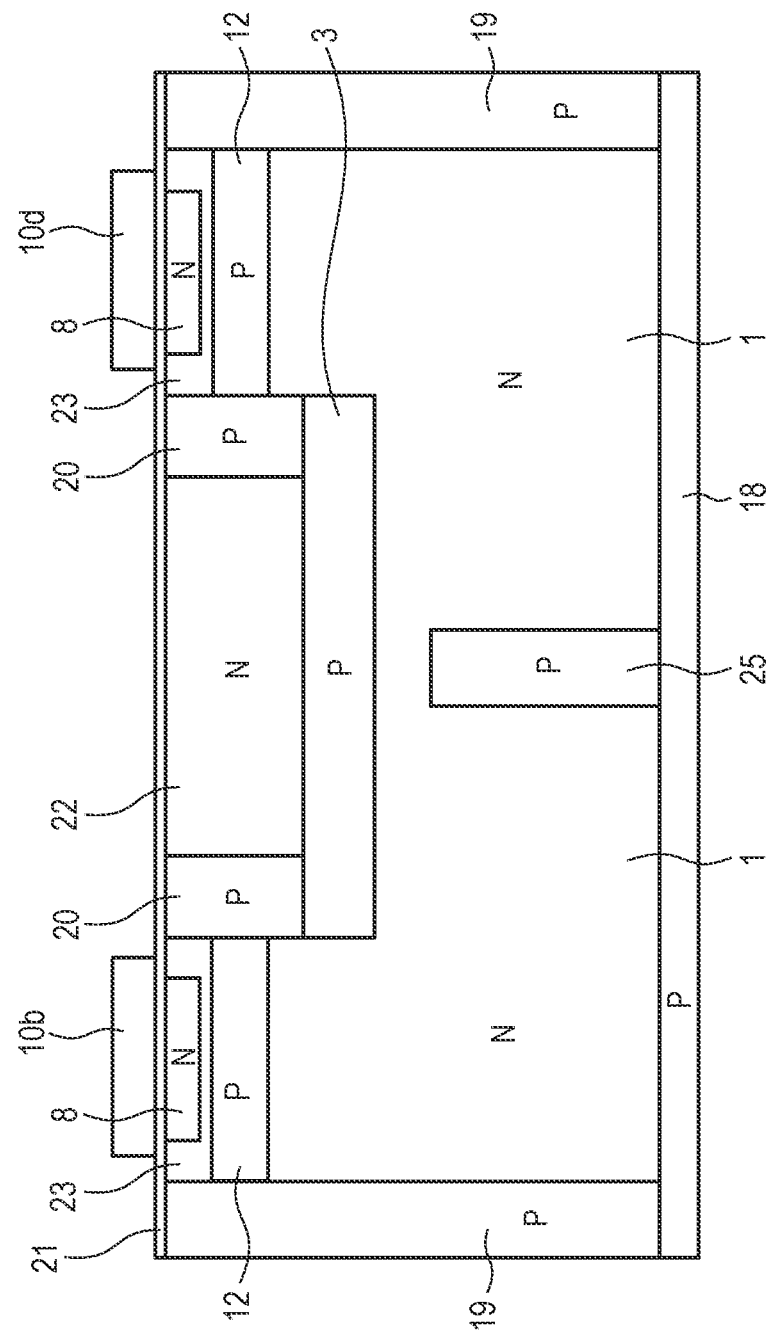
FIG. 10 is a schematic sectional view of the photoelectric conversion element according to the second embodiment.
Figure 11:
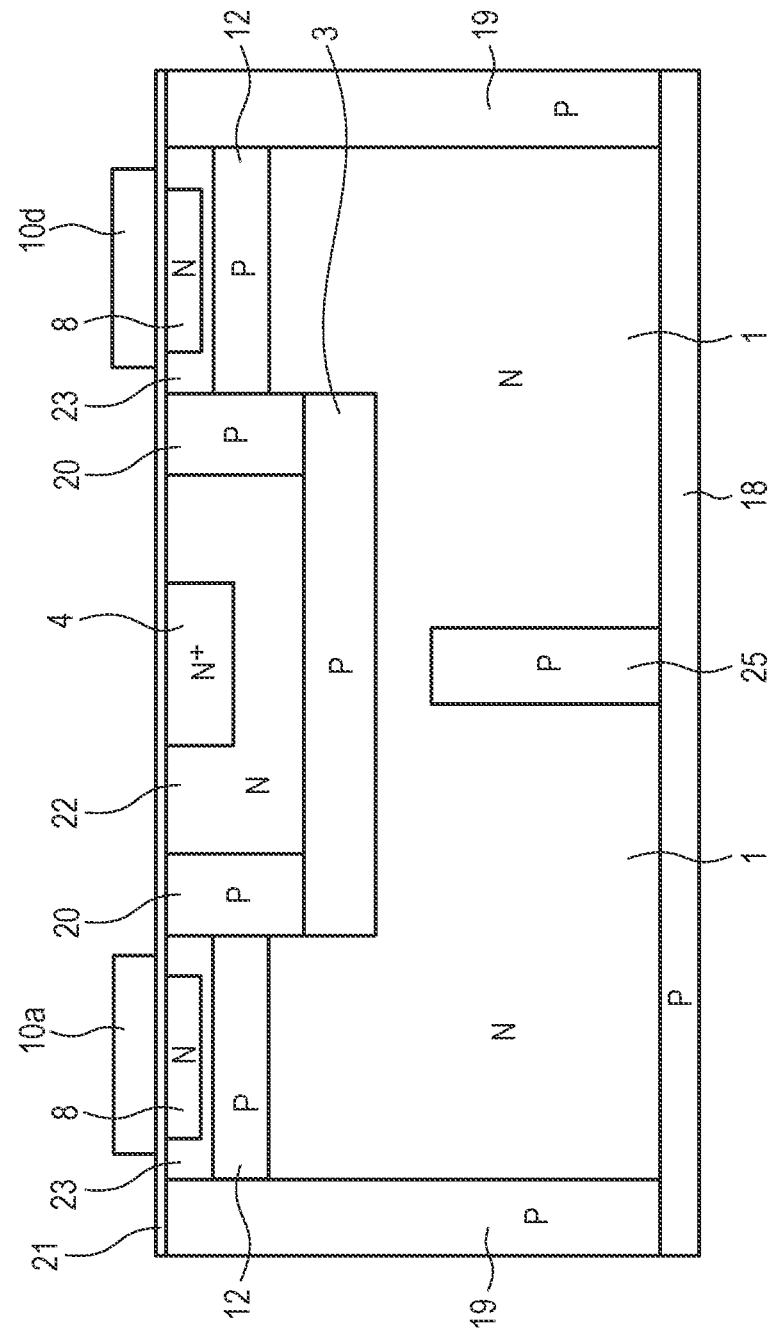
FIG. 11 is a schematic sectional view of the photoelectric conversion element according to the second embodiment.

FIG. 9 is a schematic plan view of the photoelectric conversion element 101 according to the present embodiment, and FIG. 10 and FIG. 11 are schematic sectional views of the photoelectric conversion element 101 according to the present embodiment. FIG. 10 illustrates a cross section taken along a line B-B' of FIG. 9. FIG. 11 illustrates a cross section taken along a line C-C' of FIG. 9. The structure of the photoelectric conversion element 101 will be described with reference to FIG. 9 to FIG. 11 each other.

The photoelectric conversion element 101 has one APD 2 having the same configuration as that of the first embodiment near the center in plan view. Further, the photoelectric conversion element 101 has four pairs of the PD 13 having the same configuration as that of the first embodiment and a charge holding portion formed of the N-type semiconductor region 8 in four portions of a left-upper part, a left-under part, a right-upper part, and a right-under part in plan view. The photoelectric conversion element 101 has a P-type semiconductor region 25 having a cross shape in plan view. The P-type semiconductor region 25 functions as an isolation region that isolates the four pairs of the PD 13 and the charge holding portion from each other. Accordingly, it is possible to prevent signal electrons from moving between the four pairs of the PD 13 and the charge holding portion.

Separate potentials can be applied to four electrodes 10a, 10b, 10c, and 10d that control the potentials of the charge holding portions, respectively. Accordingly, the four charge holding portions can perform operations of charge transfer, independently.

As illustrated in FIG. 10 and FIG. 11, the P-type semiconductor region 25 is arranged such that a part of the N-type semiconductor region 1 is interposed between the P-type semiconductor region 3 and the P-type semiconductor region 25. In other words, there is a gap between the P-type semiconductor region 25 and the P-type semiconductor region 3. With such a configuration, it is possible to prevent transfer from being obstructed due to the P-type semiconductor region 25 when a signal electron is transferred from the N-type semiconductor region 8 to the N-type semiconductor region 22 of the APD 2. Further, in such a configuration, since a potential barrier is formed between adjacent parts of the N-type semiconductor region 1 due to the P-type semiconductor region 25 in the accumulation period, the adjacent parts of the N-type semiconductor region 1 are electrically isolated.

Figure 12:
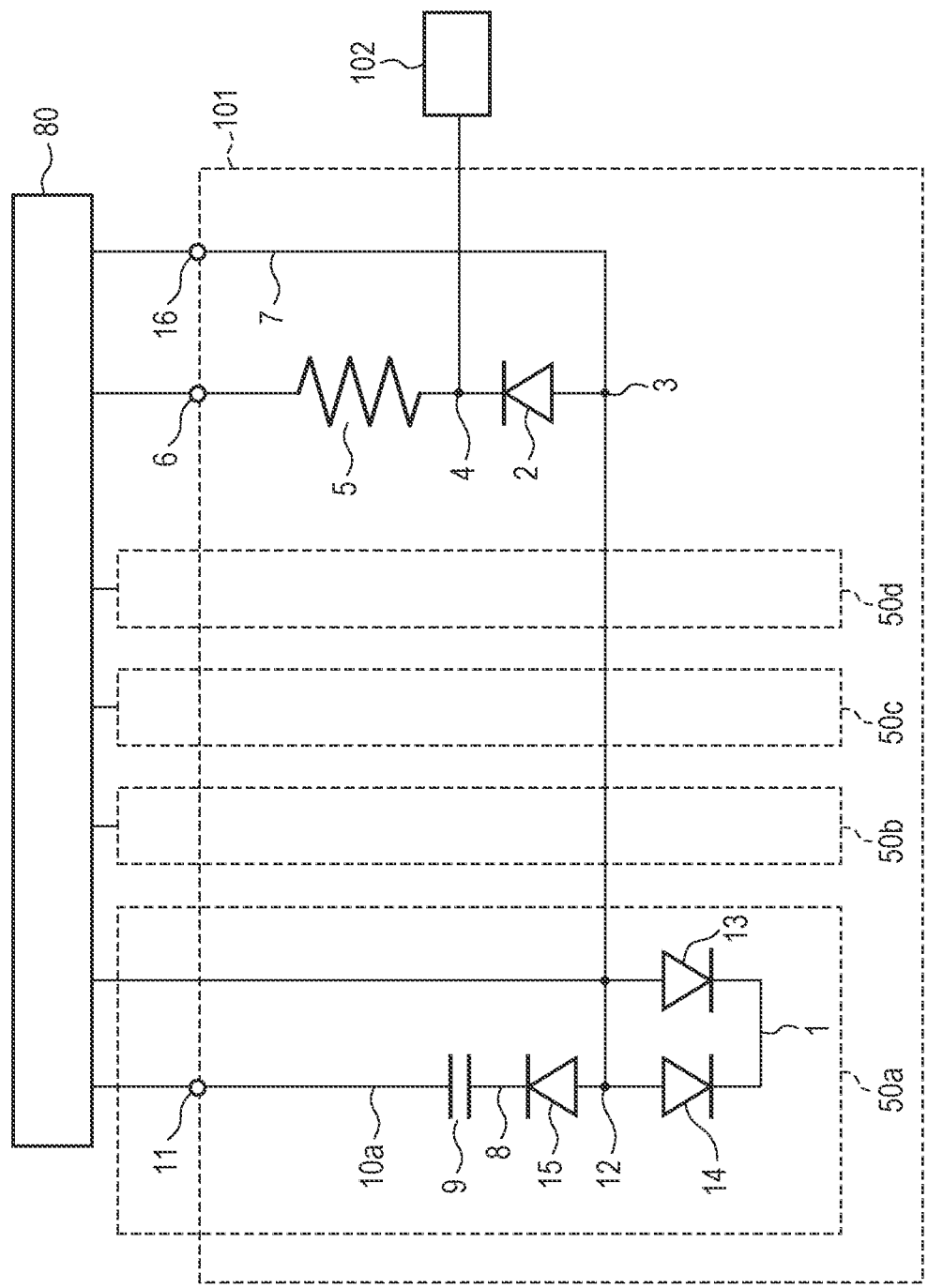
FIG. 12 is an equivalent circuit diagram of the photoelectric conversion element according to the second embodiment.

FIG. 12 is an equivalent circuit diagram of the photoelectric conversion element 101 according to the present embodiment. The difference from the first embodiment is in that four sets of signal charge output units 50a, 50b, 50c, and 50d each including the PD 13, the charge holding portion, the transfer path of charges, and the like are provided. The four signal charge output units 50a, 50b, 50c, and 50d are connected to the APD 2 in parallel. Since each structure of the signal charge output units 50b, 50c, and 50d is the same as that of the signal charge output unit 50a, the illustration thereof is omitted in FIG. 12.

Figure 13:
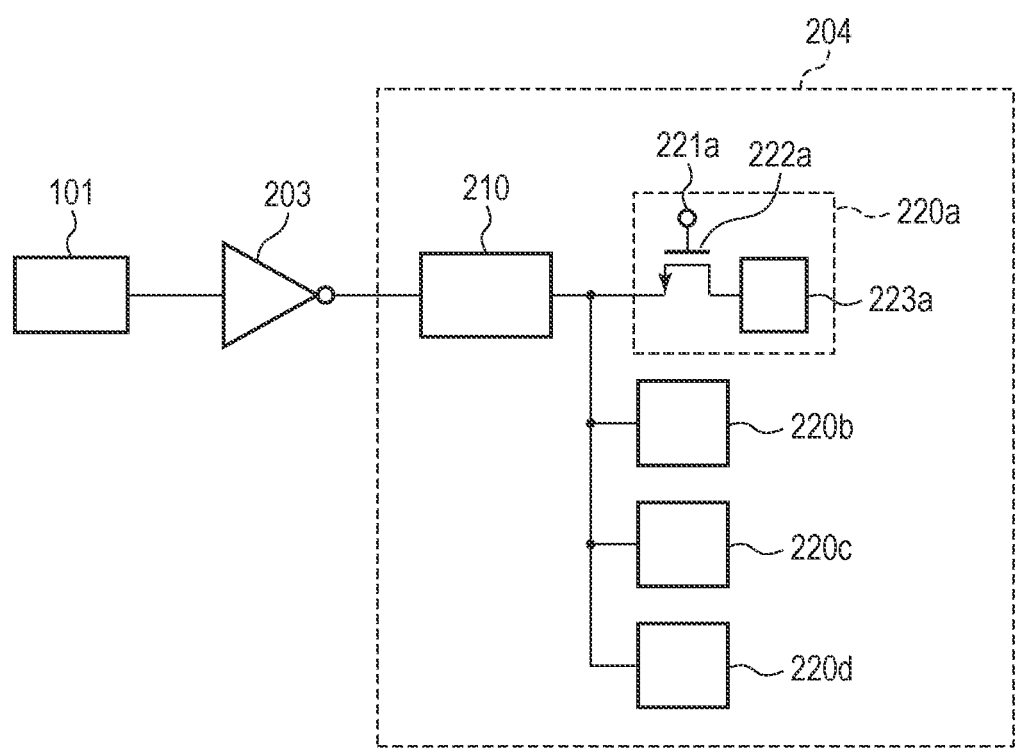
FIG. 13 is a block diagram of a pixel signal processing unit according to the second embodiment.

FIG. 13 is a block diagram of the pixel signal processing unit 102 according to the present embodiment. Out of the configuration of the block diagram illustrated in FIG. 3, the illustration of components other than the photoelectric conversion element 101, the inverter circuit 203, and the counter circuit 204 is omitted in FIG. 13. The counter circuit 204 includes one counter 210 and four memory units 220a, 220b, 220c, and 220d. The memory unit 220a has a MOS transistor 222a and the memory 223a. Since each structure of the memory units 220b, 220c, and 220d is the same as that of the memory unit 220a, the illustration thereof is omitted in FIG. 13.

The output terminal of the inverter circuit 203 is connected to the input terminal of the counter 210. The output terminal of the counter 210 is connected to the input terminals of the memory units 220a, 220b, 220c, and 220d. The source of the MOS transistor 222a is connected to the output terminal of the counter 210. The drain of the MOS transistor 222a is connected to the input terminal of the memory 223a. A control voltage is input to the gate of the MOS transistor 222a from the terminal 221a. Description of each structure and each connection relationship of the memory units 220b, 220c, and 220d is the same as that of the memory unit 220a and thus will be omitted. In such a way, in the present embodiment, the output terminal of the counter 210 is connected to the four memories via MOS transistors that function as switches.

In response to the counter 210 counting the number of signal electrons output from the signal charge output unit 50a, the MOS transistors 222a is controlled to be turned on, and thereby the count value thereof is stored in the memory 223a. In such a way, the memory unit 220a stores the number of signal electrons from the signal charge output unit 50a. Similarly, the memory units 220b, 220c, and 220d store the numbers of signal electrons from the signal charge output units 50b, 50c, and 50d, respectively. In such a way, the four signal charge output units 50a, 50b, 50c, and 50d and the four memory units 220a, 220b, 220c, and 220d correspond to each other in a one-to-one manner.

As described above, in the present embodiment, the APD 2, the inverter circuit 203, and the counter 210 are shared by the four signal charge output units 50a, 50b, 50c, and 50d and the four memory units 220a, 220b, 220c, and 220d.

Since an APD applied with a high electric field is required to have a certain size of area, it is generally difficult to reduce the element area of the APD. Thus, for some cases, there was a problem of difficulty in reduction in size of a photoelectric conversion device using APDs. In the present embodiment, however, since the four signal charge output units 50a, 50b, 50c, and 50d are structured to share one APD 2, it is possible to reduce the number of APDs 2 to be arranged relative to the number of the signal charge output units 50a, 50b, 50c, and 50d. Therefore, the element area required for arrangement of the APDs 2 can be reduced.

Further, in general, the circuit scale of a counter is often much larger than that of a memory circuit if the number of bits is the same. The present embodiment has the structure in which four signal charge output units 50a, 50b, 50c, and 50d and the four memory units 220a, 220b, 220c, and 220d share one counter 210. Thus, it is possible to reduce the number of counters 210 to be arranged relative to the number of signal charge output units 50a, 50b, 50c, and 50d and memory units 220a, 220b, 220c, and 220d. That is, in the present embodiment, one memory unit and one-fourth counter are allocated to one signal charge output unit, and this facilitates a reduction in the circuit scale compared to the configuration in which one counter is allocated to one signal charge output unit.

Further, in the present embodiment, the resistor 5 and the inverter circuit 203 are also shared by the four signal charge output units 50a, 50b, 50c, and 50d and the four memory units 220a, 220b, 220c, and 220d, and the beneficial effect of a reduction in the element area is similarly obtained.

Because of at least one reason described above, according to the present embodiment, a reduction in size of the photoelectric conversion device 1010 is realized in addition to the beneficial effects described in the first embodiment.

Note that, although the number of signal charge output units 50a, 50b, 50c, and 50d is four and the number of the memory units 220a, 220b, 220c, and 220d is four in the description of the present embodiment, this is an example, and the same beneficial effect is obtained as long as these numbers are plural.

Third Embodiment

The photoelectric conversion device 1010 of the present embodiment has a function of enabling transfer of a signal electron and analog-to-digital (AD) conversion on a signal based on the signal electron with the APD 2 remaining in the inactive state where no avalanche multiplication occurs. In the illustration of the present embodiment, the description of components common to the first embodiment may be omitted or simplified.

Figure 14:
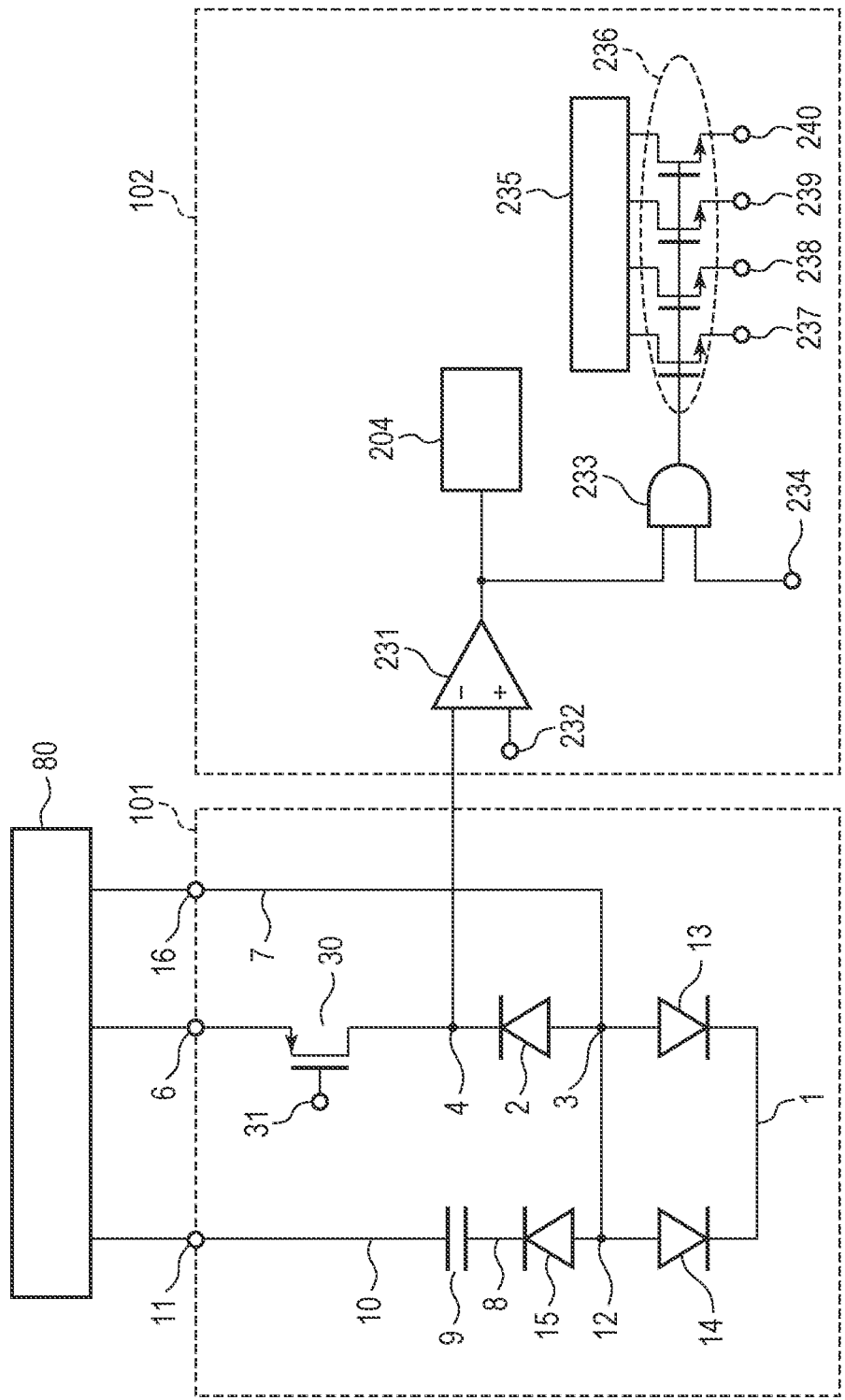
FIG. 14 is a diagram illustrating a configuration of a photoelectric conversion device according to a third embodiment.

FIG. 14 is a diagram illustrating the configuration of the photoelectric conversion device 1010 according to the third embodiment. The photoelectric conversion device 1010 has the photoelectric conversion element 101 and the pixel signal processing unit 102 in the same manner as in FIG. 2 and FIG. 3 of the first embodiment. The difference in the photoelectric conversion element 101 from the first embodiment is in that the resistor 5 of FIG. 2 is replaced with a P-type MOS transistor 30. The source of the MOS transistor 30 is connected to the terminal 6. The drain of the MOS transistor 30 is connected to the N-type semiconductor region 4. A control signal is input to the gate of the MOS transistor 30 from the terminal 31.

The differences from the first embodiment in the pixel signal processing unit 102 are in that the inverter circuit 203 of FIG. 3 is replaced with a comparator 231 and that an AND gate 233, a digital memory 235, and a switch group 236 are added. Accordingly, the pixel signal processing unit 102 functions as an AD conversion unit.

The inverting input terminal of the comparator 231 is connected to the N-type semiconductor region 4. A comparison signal is input to the non-inverting input terminal of the comparator 231 from a terminal 232. The comparison signal is a ramp signal whose voltage changes in accordance with time, for example. The output terminal of the comparator 231 is connected to the counter circuit 204 and the first input terminal of the AND gate 233. A control signal is input to the second input terminal of the AND gate 233 from a terminal 234. The level of the output signal from the AND gate 233 corresponds to a logical product of the level of an input signal to the first input terminal and the level of an input signal to the second input terminal.

The switch group 236 includes a plurality of N-type MOS transistors. Although the number of MOS transistors included in the switch group 236 is four in FIG. 14, the number is not limited thereto, and typically, more MOS transistors may be included. The output terminal of the AND gate 233 is connected to each gate of the plurality of MOS transistors. The sources of the plurality of MOS transistors are connected to the terminals 237, 238, 239, and 240. The drains of the plurality of MOS transistors are connected to the digital memory 235. The digital memory 235 stores the level of the potential of a node to which a MOS transistor is connected. Although the digital memory 235 is configured to store 4-bit digital data in FIG. 14, the number of bits is not limited thereto, and typically, a greater number of bits may be stored.

Figure 15:
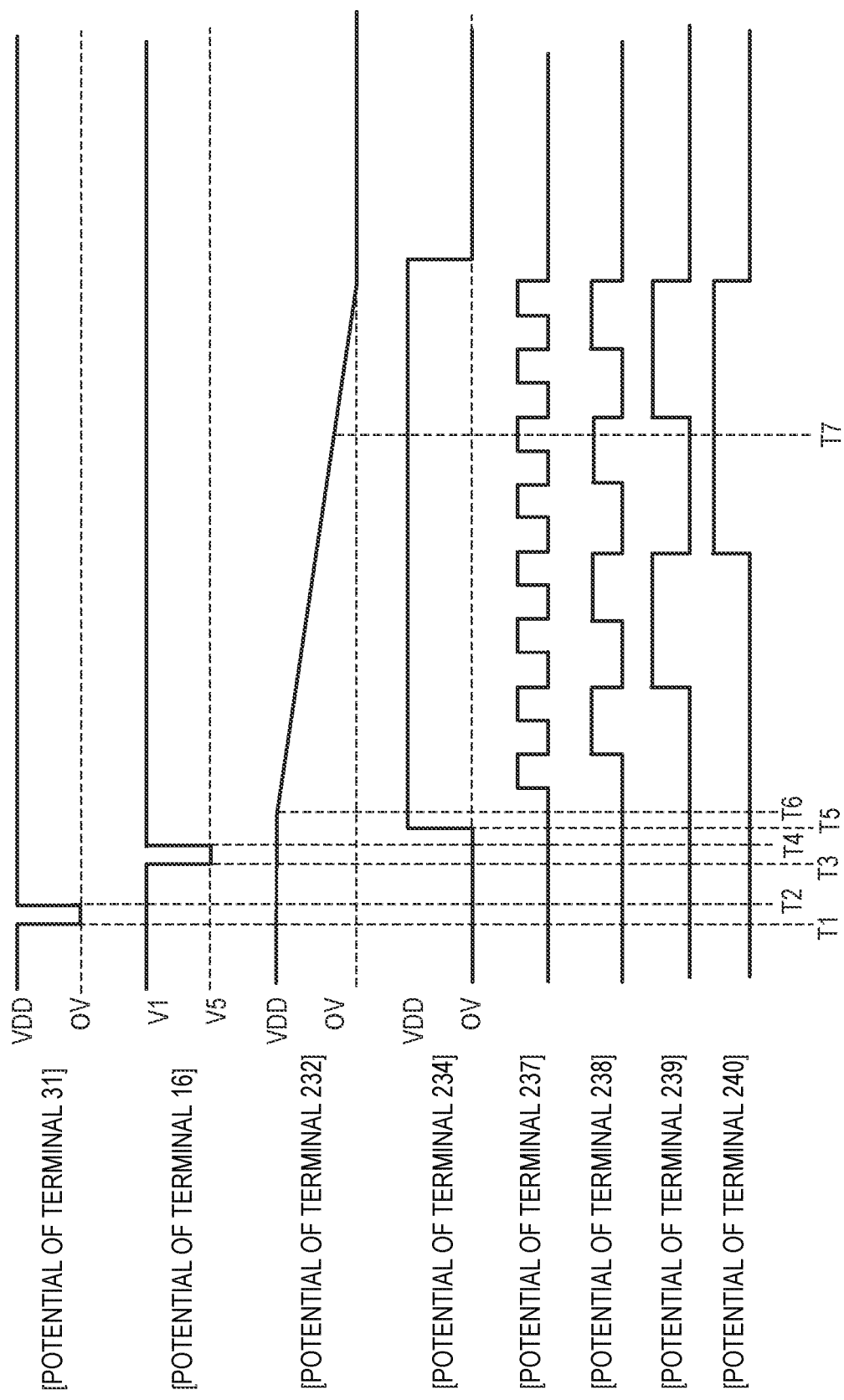
FIG. 15 is a timing diagram illustrating the operation of the photoelectric conversion device according to the third embodiment.

FIG. 15 is a timing diagram illustrating the operation of the photoelectric conversion device 1010 according to the third embodiment. FIG. 15 illustrates an AD conversion operation performed after the accumulation period described in the first embodiment. That is, it is assumed that signal electrons have already been accumulated in the N-type semiconductor region 1 before the process of FIG. 15. The AD conversion operation in the photoelectric conversion device 1010 will be described with reference to FIG. 14 and FIG. 15.

At time T1, the potential of the terminal 31 changes from VDD to 0 V. Thereby, the MOS transistor 30 is turned on, and the potential of the N-type semiconductor region 4 is reset to the potential in accordance with the potential of the terminal 6. The potential of the N-type semiconductor region 4 at the time of reset is 3 V, for example. At time T2, the potential of the terminal 31 returns to VDD, and the reset is cancelled.

At time T3, the potential of the terminal 16 changes from V1 to V5. Thereby, the potential of the P-type semiconductor region 3 decreases, and a signal electron is transferred from the N-type semiconductor region 1 to the N-type semiconductor region 4. The potential V5 is −15 V, for example. At this time, the reverse bias voltage of the APD 2 is 18 V, which is lower than 25 V at which avalanche multiplication of the APD 2 occurs. Therefore, the APD 2 at this time remains in the inactive state. The potential of the terminal 11 at this time is −20 V, for example, and most of the N-type semiconductor region 8 is in a state of being unable to accept electrons because of accumulated holes. Therefore, the signal electron does not move to the N-type semiconductor region 8 and is transferred to the N-type semiconductor region 4. At time T4, the potential of the terminal 16 returns to V1, and the transfer ends.

In this transfer, not all of the signal electrons accumulated in the N-type semiconductor region 1 are transferred to the N-type semiconductor region 4. Exceeding signal electrons above a certain number are transferred to the N-type semiconductor region 4 when a large number of signal electrons are accumulated in the N-type semiconductor region 1. This is because, when V5 is −15 V, for example, the potential barrier between the N-type semiconductor region 1 and the N-type semiconductor region 4 does not fully decrease, and some of the signal electrons remain in the N-type semiconductor region 1. Note that the certain number described above is around 200, for example.

At time T5, the potential of the terminal 234 changes from 0 V to VDD. Thereby, the level of the output signal of the AND gate 233 matches the level of the output signal of the comparator 231.

At time T6, the potential of the terminal 232 gradually changes from VDD to 0 V. Further, on and after time T6, the potentials of the terminals 237, 238, 239, and 240 repeat transition between the high level and the low level so as to indicate a binary number that increases in accordance with passage of time. That is, the voltage levels of the terminals 237, 238, 239, and 240 correspond to respective bit values of the first digit (the least significant bit), the second digit, the third digit, and the fourth digit in binary that indicate passage of time.

Immediately after time T6, the potential of the non-inverting input terminal of the comparator 231 is VDD, the potential of the inverting input terminal of the comparator 231 is a potential lower than VDD. Therefore, the output of the comparator 231 is at the high level, and the output of the AND gate 233 is also at the high level. Accordingly, since all the MOS transistors included in the switch group 236 are in the on-state, the potentials of the terminals 237, 238, 239, and 240 have been written in the digital memory 235.

Then, at time T7, it is assumed that the potential of the non-inverting input terminal of the comparator 231 becomes lower than the potential of the inverting input terminal of the comparator 231. At this time, the output of the comparator 231 is at the low level, and the output of the AND gate 233 is also at the low level. Thereby, all the MOS transistors included in the switch group 236 are turned off, and the potentials of the terminals 237, 238, 239, and 240 at this point of time are stored in the digital memory 235. In the example of FIG. 15, the digital value to be stored in the digital memory 235 at this time is 1011 in binary and 11 in decimal. This value indicates the quantity of signal electrons transferred from the N-type semiconductor region 1 to the N-type semiconductor region 4. This value is a digital value obtained by performing AD conversion on the quantity of signal electrons and thus does not indicate the absolute number of electrons. The number of electrons which the minimum bit of the digital value corresponds to may vary depending on the capacitance of the N-type semiconductor region 4, the slope of the potential of the terminal 232, or the like. In the following description, a signal obtained by multiplying the digital value, which is obtained by the AD conversion described above, by the number of electrons per bit and converting the product into the number equivalent to the signal electron quantity is referred to as S2 (second digital value).

Note that, to be more exact, since the reset potential of the N-type semiconductor region 4 is 3 V and the initial voltage of the terminal 232 is 3.3 V, there is an offset of 0.3 V. If the offset of 0.3 V corresponds to 3 in decimal, the net value due to the signal electrons in the example of FIG. 15 is 8 (1000 in a binary form) obtained by subtracting 3 from 11.

After the AD conversion process of FIG. 15, readout of signal electrons remaining in the N-type semiconductor region 1 is performed with the APD 2 being in the active state by using the same scheme as that in the first transfer period and the second transfer period of the first embodiment. In this readout period, the potential of the terminal 31 is maintained at a constant potential so that the on-resistance of the MOS transistor 30 functions as the resistor 5. Further, the potential of the terminal 232 is set at around VDD/2, and the comparator 231 is caused to function as the inverter circuit 203. In the following description, a signal obtained by counting the number of electrons relying on the avalanche operation after AD conversion is performed is referred to as S1 (first digital value). The signal S1 matches the number of counted electrons.

Accordingly, the photoelectric conversion device 1010 of the present embodiment can output the two signals S1 and S2. The sum of these signals (S1+S2) is a value indicating the number of signal electrons accumulated in the N-type semiconductor region 1.

The photoelectric conversion device 1010 of the present embodiment can complete readout faster than a scheme of reading out all the signal electrons one by one electron as with the first embodiment when the quantity of signal electrons accumulated in the N-type semiconductor region 1 is large. Therefore, the framerate can be increased. Furthermore, since the period in which the APD 2 is in the active state is shorter because the readout period is shorter, the period subjected to influence of dark current can be shorter. Further, since the scheme of charge transfer and AD conversion of the present embodiment consumes less power than the scheme of reading out electrons one by one, the power consumption can be reduced. Therefore, according to the present embodiment, at least one beneficial effect described above is obtained in addition to the beneficial effect described in the first embodiment.

Note that, when S1 is less than a certain threshold, S1 may be output as the quantity of signal electrons accumulated in the N-type semiconductor region 1 without summing the two signals S1 and S2. The beneficial effect obtained thereby will be described.

It is defined that noise contained in S1 is denoted as N1 and noise contained in S2 is denoted as N2. At this time, there is a relationship of N1<N2 in comparison of the noise amount in a dark state. Specifically, while N2 is at around a level of noise in a dark state in a typical CMOS sensor and typically corresponds to several electrons, N1 is close to zero. Therefore, if S2 is close to zero, a higher SN ratio will be obtained when S1 is used as a signal than when (S1+S2) is used as a signal. Further, when the number of signal electrons is small, substantially no charge is transferred in transfer at time T3 of the present embodiment. For example, when the number of signal electrons is less than or equal to 63, there is substantially no signal electron going over a potential barrier even taking into consideration that there are signal electrons having a higher energy than the average due to the energy distribution of signal electrons. In such a case, even when an algorithm to output (S1+S2) as the quantity of all the signal electrons if S1 is greater than or equal to 64 and output S1 as the quantity of all the signal electrons if S1 is less than 64 is employed, missing of count of signal electrons does not occur. Further, in this algorithm, the SN ratio is improved when S1 is less than 64 compared to the case of always summing S1 and S2.

Note that, in addition, the greater the number of signal electrons is, the more dominant the optical shot noise becomes compared to noise at a dark state. Typically, optical shot noise is dominant when the number of signal electrons is 64 or greater. Thus, there is no substantial difference in the SN ratio between a case where the number of signal electrons is large and (S1+S2) is used as a signal in the present embodiment and a case where the number of all the signal electrons is obtained by the counting relying on avalanche multiplication as with the first embodiment. Since the SN ratio is the same as that in the first embodiment when the number of signal electrons is less than 64, substantially the same SN ratio as the first embodiment is eventually obtained regardless of whether the number of signal electrons is large or small.

Although the digital memory 235 stores one signal S2 in the description of FIG. 14 and FIG. 15, the digital memory 235 may be configured to be able to further store a reset state signal. It is possible to acquire a signal indicating the level of reset noise by performing AD conversion to acquire a digital value based on the potential of the N-type semiconductor region 4 obtained at reset after the reset at time T1. It is possible to remove influence of reset noise from S2 by subtracting this signal obtained at reset from S2, and a beneficial effect of further improved accuracy is obtained.

Fourth Embodiment

The present embodiment is a modified example of the structure of the photoelectric conversion element 101 described in the first embodiment. In the illustration of the present embodiment, the description of components common to the first embodiment may be omitted or simplified.

Figure 16:
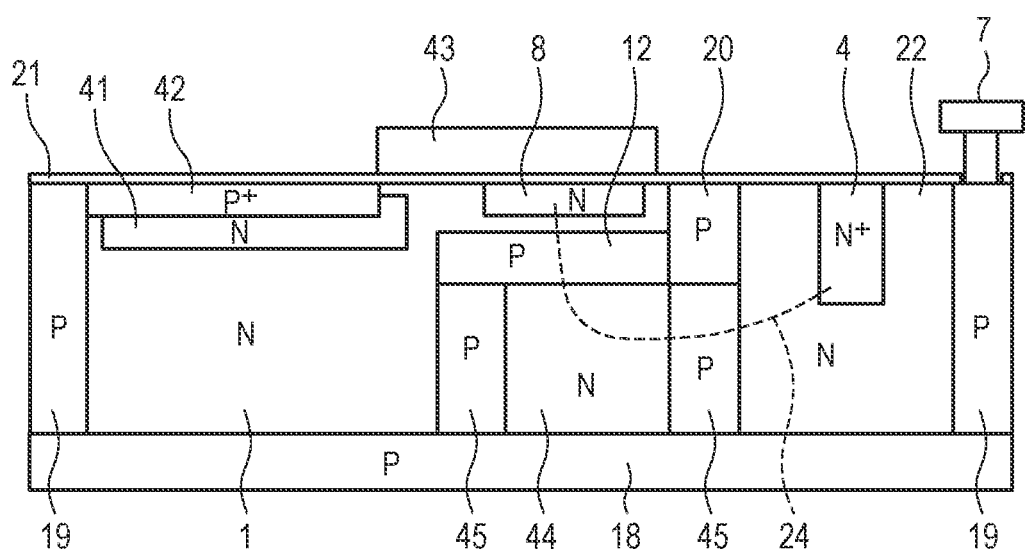
FIG. 16 is a schematic sectional view of a photoelectric conversion element according to a fourth embodiment.

FIG. 16 is a schematic sectional view of the photoelectric conversion element 101 according to the present embodiment. The photoelectric conversion element 101 has a P-type semiconductor region 45 (fifth semiconductor region) instead of the P-type semiconductor region 3 of the first embodiment and has an electrode 43 instead of the electrode 10 of the first embodiment. Further, the photoelectric conversion element 101 has N-type semiconductor regions 41 and 44 and P-type semiconductor regions 42 and 45.

The N-type semiconductor region 44 (fourth semiconductor region) is arranged above the P-type semiconductor region 18 and below the P-type semiconductor region 12 (third semiconductor region). The P-type semiconductor region 45 is arranged to isolate the N-type semiconductor region 44 and the N-type semiconductor region 22 from each other and isolate the N-type semiconductor region 44 and the N-type semiconductor region 1 from each other. The N-type semiconductor region 4 is the cathode of the APD 2, and the P-type semiconductor region 45 is the anode of the APD 2. Although the interface of the junction forming the APD 2 extends in the vertical direction in the present embodiment, the interface may extend in the horizontal direction in the same manner as in the first embodiment.

The transfer path 24 indicated by a dashed line in FIG. 16 is a path through which signal charges are transferred to the APD 2 from the N-type semiconductor region 8 that functions as a charge holding portion. That is, the P-type semiconductor region 12, the N-type semiconductor region 44, the P-type semiconductor region 45, and the N-type semiconductor region 22 are arranged on the transfer path 24. Further, most of the N-type semiconductor region 1 is arranged outside the transfer path 24.

The N-type semiconductor region 41 is arranged above the N-type semiconductor region 1 (sixth semiconductor region), and the P-type semiconductor region 42 having a high concentration is arranged above the N-type semiconductor region 41. The N-type semiconductor region 41 and the P-type semiconductor region 42 form an embedded PD. Since the PN junction between the N-type semiconductor region 41 and the P-type semiconductor region 42 has a large capacitance, most of signal electrons generated by the N-type semiconductor region 1 are accumulated in the N-type semiconductor region 41.

The electrode 43 is arranged so as to extend above the N-type semiconductor region 8 (first semiconductor region) and above the gap between the embedded PD and the N-type semiconductor region 8. The electrode 43 is a transfer gate that transfers charges accumulated in the N-type semiconductor region 41 to the N-type semiconductor region 8. Further, the electrode 43 also has the same function as the electrode 10 of the first embodiment. The potential barrier between the N-type semiconductor region 8 and the N-type semiconductor region 44 is lower than the potential barrier between the N-type semiconductor region 1 and the N-type semiconductor region 8.

In the present embodiment, unlike the first embodiment, the N-type semiconductor regions 1 and 41 that photoelectrically convert incident light and accumulate signal charges are arranged outside the transfer path 24. Accordingly, it is possible to arrange the N-type semiconductor regions 1 and 41 up to a deep position from the incident surface (the underside in FIG. 16) and widen the sensitive region. This improves sensitivity. A micro-lens that guides incident light to the N-type semiconductor regions 1 and 41 may be provided on the incident surface side, and in such a case, the sensitivity is further improved. Further, in the structure of the present embodiment, since an embedded PD can be provided, the number of saturated electrons can be increased. Therefore, according to the present embodiment, at least one beneficial effect described above is obtained in addition to the beneficial effects described in the first embodiment.

Note that, since the area in plan view increases in the structure of the present embodiment, the structure in which the N-type semiconductor region 1 is included in the transfer path 24 as with the first embodiment may be more effective for a product in which reduction in size is prioritized.

Fifth Embodiment

Figure 17:
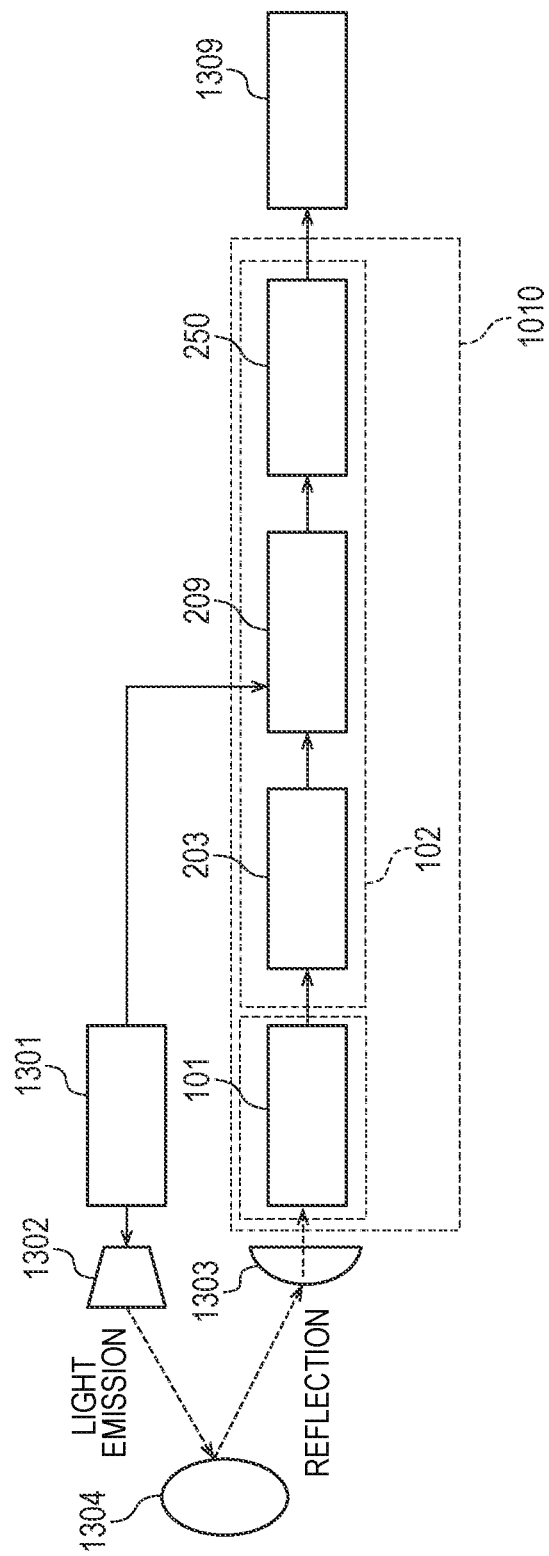
FIG. 17 is a block diagram illustrating a general configuration of a photoelectric conversion system according to a fifth embodiment.

A photoelectric conversion system according to a fifth embodiment of the present disclosure will be described with reference to FIG. 17. FIG. 17 is a block diagram illustrating a configuration example of the photoelectric conversion system according to the present embodiment.

In the present embodiment, another example of the photoelectric conversion system using the photoelectric conversion device 1010 of any of the first to fourth embodiments will be described with reference to FIG. 17. Components having the same function as those of FIG. 1 to FIG. 16 are labeled with the same references, and the description thereof will be omitted or simplified.

First, a distance detection system that is an example of a photoelectric conversion system will be described with reference to FIG. 17. Note that the pixel 100 of the present embodiment has a TDC 209 and a memory 250 instead of the counter circuit 204 of FIG. 3.

FIG. 17 is a block diagram of the distance detection system. The distance detection system has a light source control unit 1301, a light-emitting unit 1302, an optical member 1303, the photoelectric conversion device 1010, and a distance calculation unit 1309.

The light source control unit 1301 controls driving of the light-emitting unit 1302. The light-emitting unit 1302 is a light-emitting device that emits light of a short pulse (sequence) in a capturing direction in accordance with a signal from the light source control unit 1301.

The light emitted from the light-emitting unit 1302 is reflected by an object 1304. The reflected light is received by the photoelectric conversion element 101 of the photoelectric conversion device 1010 through the optical member 1303 such as a lens. The photoelectric conversion element 101 outputs a signal based on incident light, and the signal is input to the TDC 209 via the inverter circuit 203.

The TDC 209 acquires, from the light source control unit 1301, a signal indicating a timing of light emission from the light-emitting unit 1302. The TDC 209 compares a signal acquired from the light source control unit 1301 with a signal input from the inverter circuit 203. Thereby, the TDC 209 outputs, as a digital signal, a period from the time the light-emitting unit 1302 emits pulsed light to the time the reflected light reflected by the object 1304 is received. The digital signal output from the TDC 209 is held in the memory 250. This process is repeated for multiple times, and the memory 250 can hold digital signals for the multiple times.

The distance calculation unit 1309 calculates the distance from the photoelectric conversion device 1010 to the object 1304 based on a plurality of digital signals held in the memory 250. This distance detection system can be applied to an on-vehicle distance detection device, for example. Note that, since the process performed in the distance calculation unit 1309 is a process of digital signals, the distance calculation unit 1309 may be called a signal processing unit, a signal processing circuit, or the like in a more general sense.

Sixth Embodiment

Figure 18A:
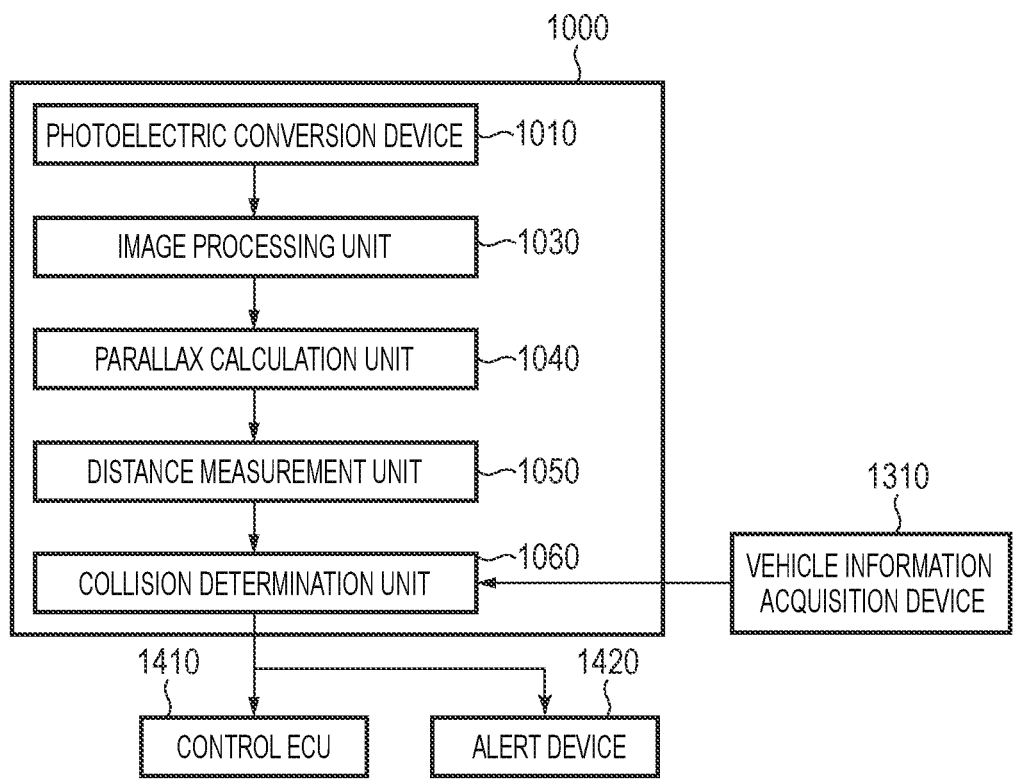
FIG. 18A and FIG. 18B are diagrams illustrating a configuration example of an imaging system and a moving body according to a sixth embodiment.
Figure 18B:
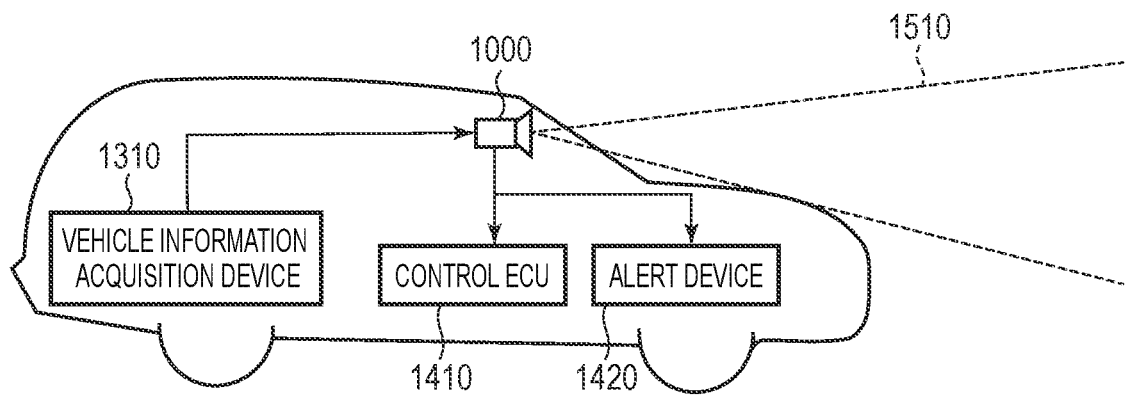

An imaging system and a moving body according to a sixth embodiment of the present disclosure will be described with reference to FIG. 18A and FIG. 18B. FIG. 18A and FIG. 18B are diagrams illustrating the configuration of a photoelectric conversion system 1000 and the moving body according to the present embodiment.

FIG. 18A is a block diagram illustrating an example of the photoelectric conversion system 1000 related to an on-vehicle camera. The photoelectric conversion system 1000 has the photoelectric conversion device 1010 according to any of the above first to fourth embodiments. The photoelectric conversion system 1000 has an image processing unit 1030 that performs image processing on a plurality of digital signals acquired by the photoelectric conversion device 1010. Furthermore, the photoelectric conversion system 1000 has a parallax calculation unit 1040 that calculates a parallax (a phase difference of parallax images) from the plurality of image data acquired by the image processing unit 1030.

Further, the photoelectric conversion system 1000 has a distance measurement unit 1050 that calculates a distance to an object based on the calculated parallax and a collision determination unit 1060 that determines whether or not there is a collision possibility based on the calculated distance. Herein, the parallax calculation unit 1040 and the distance measurement unit 1050 are an example of a distance information acquisition unit (or a distance information acquisition circuit) that acquires distance information on the distance to an object. That is, the distance information is information on a parallax, a defocus amount, a distance to an object, or the like.

The collision determination unit 1060 may use any of the distance information to determine the collision possibility. The distance information acquisition unit may be implemented by dedicatedly designed hardware, may be implemented by a software module, or may be implemented by a combination thereof. Further, the distance information acquisition unit may be implemented by a field programmable gate array (FPGA), an application specific integrated circuit (ASIC), or the like or may be implemented by combination thereof.

The photoelectric conversion system 1000 is connected to the vehicle information acquisition device 1310 and can acquire vehicle information such as a vehicle speed, a yaw rate, a steering angle, or the like. Further, the photoelectric conversion system 1000 is connected to a control ECU 1410, which is a control unit (control circuit) that outputs a control signal that causes a vehicle to generate braking force based on a determination result obtained by the collision determination unit 1060.

Further, the photoelectric conversion system 1000 is also connected to an alert device 1420 that issues an alert to the driver based on a determination result obtained by the collision determination unit 1060. For example, when the collision probability is high as the determination result of the collision determination unit 1060, the control ECU 1410 performs vehicle control to avoid a collision or reduce damage by applying a brake, pushing back an accelerator, suppressing engine power, or the like. The alert device 1420 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the photoelectric conversion system 1000. FIG. 18B illustrates the photoelectric conversion system 1000 when a front area of a vehicle (a capturing area 1510) is captured. The vehicle information acquisition device 1310 transmits an instruction to the photoelectric conversion system 1000 or the photoelectric conversion device 1010 so as to perform a predetermined operation. With such a configuration, it is possible to further improve accuracy in ranging. The vehicle may further have a control unit that controls the vehicle, which is a moving body, based on the distance information.

Although the control for avoiding a collision to another vehicle has been described in the above example, the photoelectric conversion system 1000 is applicable to control for performing automatic driving to follow another vehicle, control for performing automatic driving so as not to go out of a traffic lane, or the like. Furthermore, the photoelectric conversion system 1000 can be applied to moving bodies (moving apparatus) such as a ship, an airplane, or an industrial robot, for example, without being limited to vehicles. In addition, the photoelectric conversion system can be widely applied to a device which utilizes object recognition, such as an intelligent transportation system (ITS), without being limited to moving bodies.

According to the present embodiment, it is possible to provide a higher-performance photoelectric conversion system and a higher-performance moving body by using the photoelectric conversion device 1010 with improved detection performance.

Modified Embodiments

The present disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present disclosure.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-013718, filed Jan. 30, 2020, which is hereby incorporated by reference herein in its entirety.

What is claimed is:
1. A photoelectric conversion device comprising:
at least one charge holding portion including a first semiconductor region of a first conductivity type formed under an electrode via an insulating layer and configured to hold signal charges based on incident light; and
an avalanche photodiode including a second semiconductor region of the first conductivity type and a third semiconductor region of a second conductivity type that is different from the first conductivity type,
wherein the signal charges are transferred from the first semiconductor region to the second semiconductor region via a fourth semiconductor region of the first conductivity type, and the third semiconductor region of the second conductivity type in this order, and wherein the first semiconductor region is arranged above the fourth semiconductor region.

2. The photoelectric conversion device according to claim 1, wherein in a period in which the signal charges are generated by photoelectric conversion, the avalanche photodiode is in an inactive state where no avalanche multiplication occurs.

3. The photoelectric conversion device according to claim 1, wherein the fourth semiconductor region generates the signal charges by photoelectrically converting incident light entering the fourth semiconductor region.

4. The photoelectric conversion device according to claim 3, wherein the signal charges generated in the fourth semiconductor region are transferred from the fourth semiconductor region to the first semiconductor region.

5. The photoelectric conversion device according to claim 1 further comprising a sixth semiconductor region configured to generate the signal charges by photoelectrically converting incident light.

6. The photoelectric conversion device according to claim 5 further comprising a transfer gate configured to transfer the signal charges generated in the sixth semiconductor region to the first semiconductor region.

7. The photoelectric conversion device according to claim 1 further comprising a count unit configured to count the number of times of occurrence of avalanche current that occurs in the avalanche photodiode.

8. The photoelectric conversion device according to claim 1 further comprising a first electrode configured to control a potential of the first semiconductor region.

9. The photoelectric conversion device according to claim 8 further comprising an insulating layer arranged between the first semiconductor region and the first electrode.

10. The photoelectric conversion device according to claim 8 further comprising a second electrode configured to control a potential of the third semiconductor region.

11. The photoelectric conversion device according to claim 10, wherein transfer of the signal charges from the first semiconductor region to the second semiconductor region occurs in response to a change in potentials of the first electrode and the second electrode.

12. The photoelectric conversion device according to claim 1, wherein in at least a part of a period in which the signal charges are transferred from the first semiconductor region to the second semiconductor region of the avalanche photodiode, the avalanche photodiode is in an active state where avalanche multiplication occurs.

13. The photoelectric conversion device according to claim 1, wherein in at least a part of a period in which the signal charges are transferred from the first semiconductor region to the second semiconductor region of the avalanche photodiode, the avalanche photodiode is in an inactive state where no avalanche multiplication occurs.

14. The photoelectric conversion device according to claim 13 further comprising an analog-to-digital conversion unit configured to convert a voltage based on the signal charges transferred to the avalanche photodiode into a digital value.

15. The photoelectric conversion device according to claim 12, wherein the photoelectric conversion device is configured to output a first digital value based on the signal charges transferred when the avalanche photodiode is in an active state where avalanche multiplication occurs and a second digital value based on the signal charges transferred when the avalanche photodiode is in an inactive state where no avalanche multiplication occurs.

16. The photoelectric conversion device according to claim 1 comprising a plurality of charge holding portions, wherein the signal charges held in each of the plurality of charge holding portions are transferred to the single avalanche photodiode.

17. The photoelectric conversion device according to claim 16 further comprising an isolation region arranged between the plurality of charge holding portions.

18. A photoelectric conversion system comprising:
the photoelectric conversion device according to claim 1; and
a signal processing unit configured to process a signal output from the photoelectric conversion device.

19. A moving body comprising:
the photoelectric conversion device according to claim 1;
a distance information acquisition unit configured to acquire distance information on a distance to an object, from a parallax image based on signals from the photoelectric conversion device; and
a control unit configured to control the moving body based on the distance information.

20. The photoelectric conversion device according to claim 1, wherein the electrode extends beyond an outer edge of the first semiconductor region in plan view.

* * * * *